US010170528B2

(12) United States Patent
Kuwabara

(10) Patent No.: US 10,170,528 B2
(45) Date of Patent: Jan. 1, 2019

(54) DISPLAY PANEL AND MANUFACTURING METHOD THEREOF

(71) Applicant: Semiconductor Energy Laboratory Co., Ltd., Atsugi-shi, Kanagawa-ken (JP)

(72) Inventor: Hideaki Kuwabara, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/225,166

(22) Filed: Aug. 1, 2016

(65) Prior Publication Data

US 2017/0040403 A1    Feb. 9, 2017

(30) Foreign Application Priority Data

Aug. 7, 2015  (JP) .................. 2015-157620

(51) Int. Cl.
*G02F 1/133* (2006.01)
*H01L 27/32* (2006.01)
(Continued)

(52) U.S. Cl.
CPC ........ *H01L 27/3267* (2013.01); *G02F 1/1368* (2013.01); *G02F 1/13306* (2013.01); *G02F 1/133514* (2013.01); *G02F 1/133553* (2013.01); *G02F 1/134309* (2013.01); *H01L 27/1274* (2013.01); *H01L 29/42392* (2013.01); *H01L 29/78621* (2013.01); *H01L 29/78633* (2013.01);
(Continued)

(58) Field of Classification Search
CPC .................................................. G02F 1/13306
See application file for complete search history.

(56) References Cited

U.S. PATENT DOCUMENTS 6,556,260 B1   4/2003  Itou et al.
6,714,268 B2   3/2004  Wang et al.
(Continued)

FOREIGN PATENT DOCUMENTS

JP   2001-066593 A   3/2001
JP   2002-196702 A   7/2002
(Continued)

OTHER PUBLICATIONS

Shieh.H, "Transflective display by Hybrid OLED and LCD", LEOS 2005 (IEEE Lasers and Electro-Optics Society Annual Meeting), Oct. 22, 2005, pp. 650-651, IEEE.
(Continued)

*Primary Examiner* — Edmond Lau
(74) *Attorney, Agent, or Firm* — Robinson Intellectual Property Law Office; Eric J. Robinson

(57) ABSTRACT

Provided is a novel display panel that is highly convenient or reliable. The display device has two display modes: a reflective display mode and a light-emitting display mode. In the light-emitting display mode, light display is performed by transmitting light from a light-emitting element overlapping with an opening in a pixel electrode of a reflective display element. A switching element of the reflective display element and a switching element electrically connected to the light-emitting element are formed over one substrate. They are each a transistor whose channel formation region is formed in a silicon-containing film, specifically a polysilicon film.

15 Claims, 17 Drawing Sheets

(51) Int. Cl.
  *G02F 1/1343* (2006.01)
  *G02F 1/1368* (2006.01)
  *H01L 27/12* (2006.01)
  *H01L 29/423* (2006.01)
  *H01L 29/786* (2006.01)
  *G02F 1/1333* (2006.01)
  *G02F 1/1335* (2006.01)
  *G02F 1/1337* (2006.01)

(52) U.S. Cl.
  CPC .. *H01L 29/78648* (2013.01); *H01L 29/78672* (2013.01); *H01L 29/78696* (2013.01); *G02F 1/1337* (2013.01); *G02F 1/133345* (2013.01); *G02F 1/133512* (2013.01); *G02F 2001/133342* (2013.01); *G02F 2201/123* (2013.01); *G02F 2201/44* (2013.01); *G02F 2202/104* (2013.01); *G02F 2203/02* (2013.01); *H01L 2251/533* (2013.01)

(56) References Cited

U.S. PATENT DOCUMENTS

| | | |
|---|---|---|
| 6,912,021 B2 | 6/2005 | Kimura |
| 7,038,641 B2 | 5/2006 | Hirota et al. |
| 7,084,936 B2 | 8/2006 | Kato |
| 7,102,704 B2 | 9/2006 | Mitsui et al. |
| 7,176,991 B2 | 2/2007 | Mitsui et al. |
| 7,239,361 B2 | 7/2007 | Kato |
| 7,248,235 B2 | 7/2007 | Fujii et al. |
| 7,304,696 B2 | 12/2007 | Yamagishi |
| 7,385,654 B2 | 6/2008 | Mitsui et al. |
| 8,159,449 B2 | 4/2012 | Kimura et al. |
| 9,189,997 B2 | 11/2015 | Kimura et al. |
| 9,349,325 B2 | 5/2016 | Yamazaki et al. |
| 2003/0102801 A1 | 6/2003 | Senbonmatsu |
| 2003/0201960 A1 | 10/2003 | Fujieda |
| 2006/0072047 A1 | 4/2006 | Sekiguchi |
| 2008/0180618 A1 | 7/2008 | Fujieda |
| 2010/0171905 A1 | 7/2010 | Huang et al. |
| 2011/0157252 A1* | 6/2011 | Yamazaki ......... G02F 1/133555 345/690 |
| 2012/0001889 A1* | 1/2012 | Kimura ............... G09G 3/344 345/212 |
| 2012/0013601 A1* | 1/2012 | Park ................... G02B 27/2264 345/419 |
| 2012/0211737 A1* | 8/2012 | Maekawa ........... H01L 51/0018 257/40 |
| 2015/0171156 A1* | 6/2015 | Miyake ............... H01L 29/7869 257/43 |
| 2015/0279918 A1 | 10/2015 | Teraguchi et al. |
| 2016/0042702 A1 | 2/2016 | Hirakata et al. |
| 2016/0283028 A1 | 9/2016 | Yamazaki et al. |
| 2016/0299387 A1 | 10/2016 | Yamazaki et al. |
| 2017/0039931 A1* | 2/2017 | Kubota ................. G09G 5/363 |

FOREIGN PATENT DOCUMENTS

| | | |
|---|---|---|
| JP | 2002-328630 A | 11/2002 |
| JP | 2003-076302 A | 3/2003 |
| JP | 2003-157026 A | 5/2003 |
| JP | 2003-157029 A | 5/2003 |
| JP | 2003-228304 A | 8/2003 |
| JP | 2003-316295 A | 11/2003 |
| JP | 2003-322850 A | 11/2003 |
| JP | 2004-296162 A | 10/2004 |
| JP | 2007-232882 A | 9/2007 |
| JP | 4161574 | 10/2008 |
| JP | 2011-248351 | 12/2011 |
| JP | 2013-221965 A | 10/2013 |
| WO | WO-2004/053819 | 6/2004 |

OTHER PUBLICATIONS

Lee.J et al., "High ambient-contrast-ratio display using tandem reflective liquid crystal display and organic light-emitting device", Optics Express, Nov. 14, 2005, vol. 13, No. 23, pp. 9431-9438.

* cited by examiner

FIG. 1A
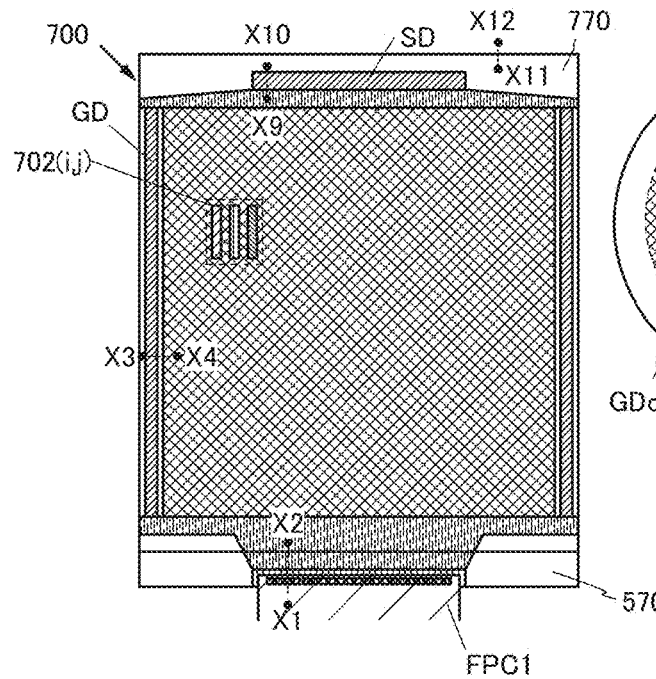
FIG. 1C
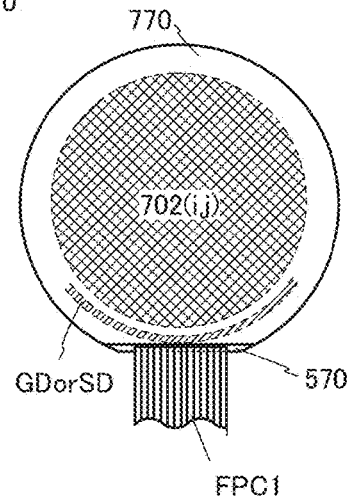
FIG. 1B1
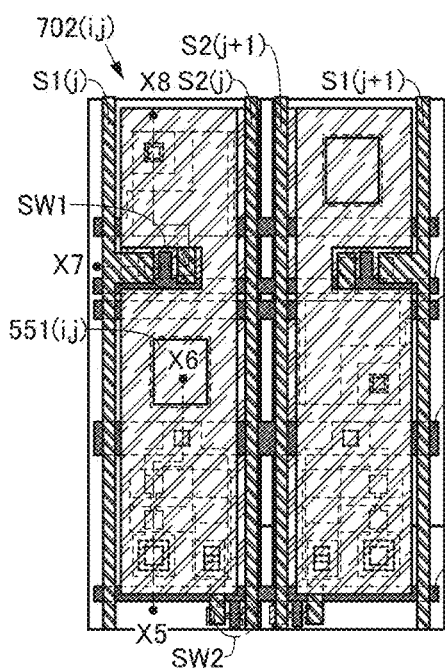
FIG. 1B2
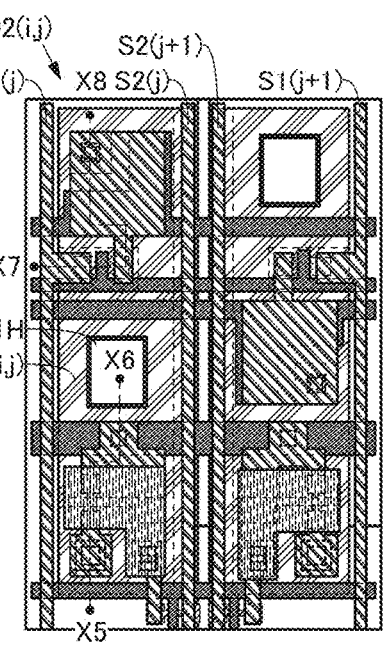

FIG. 4A
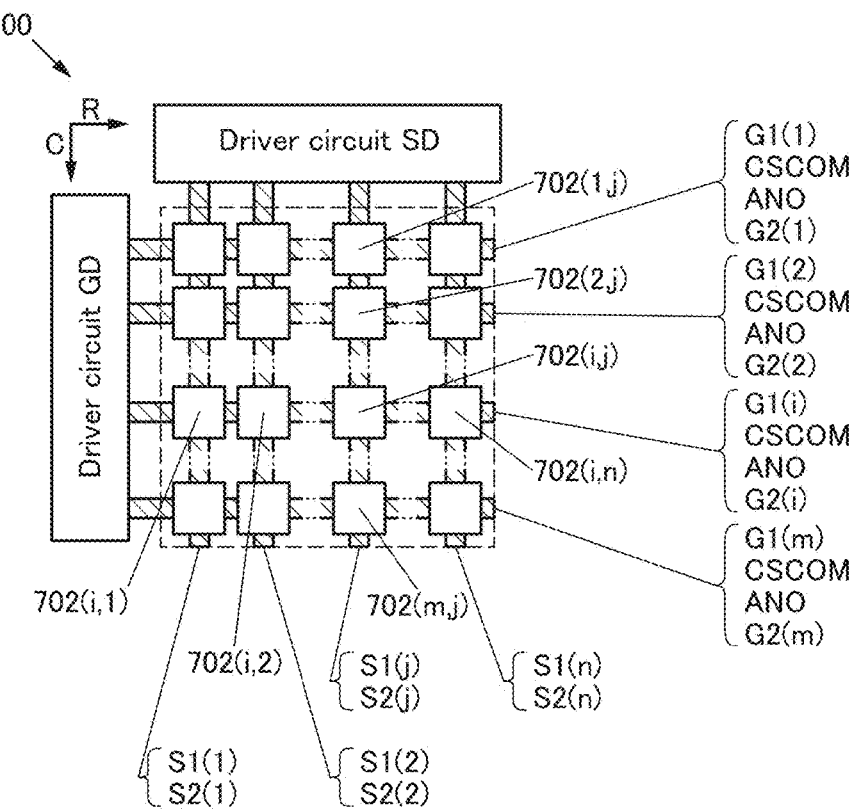
FIG. 4B1
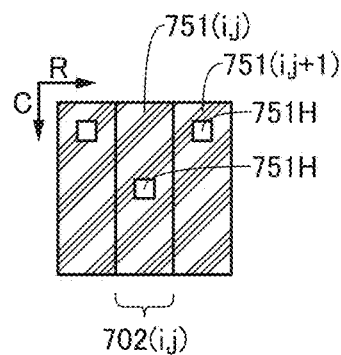
FIG. 4B2
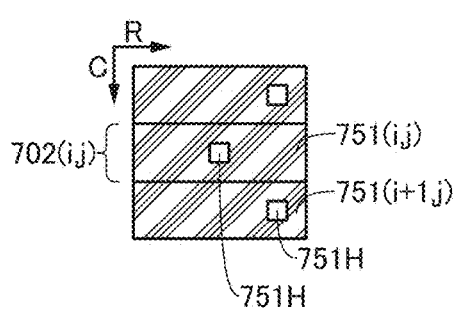

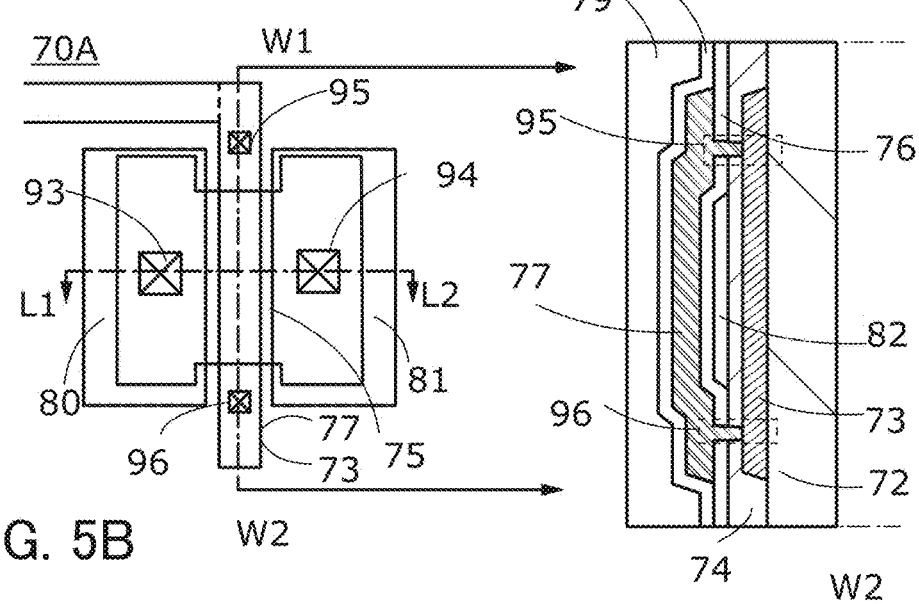
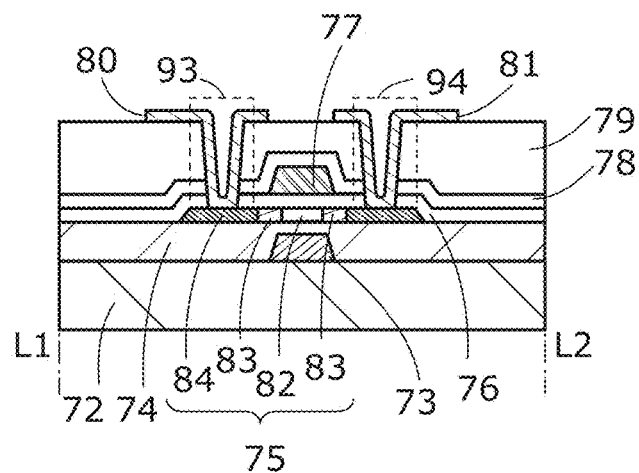

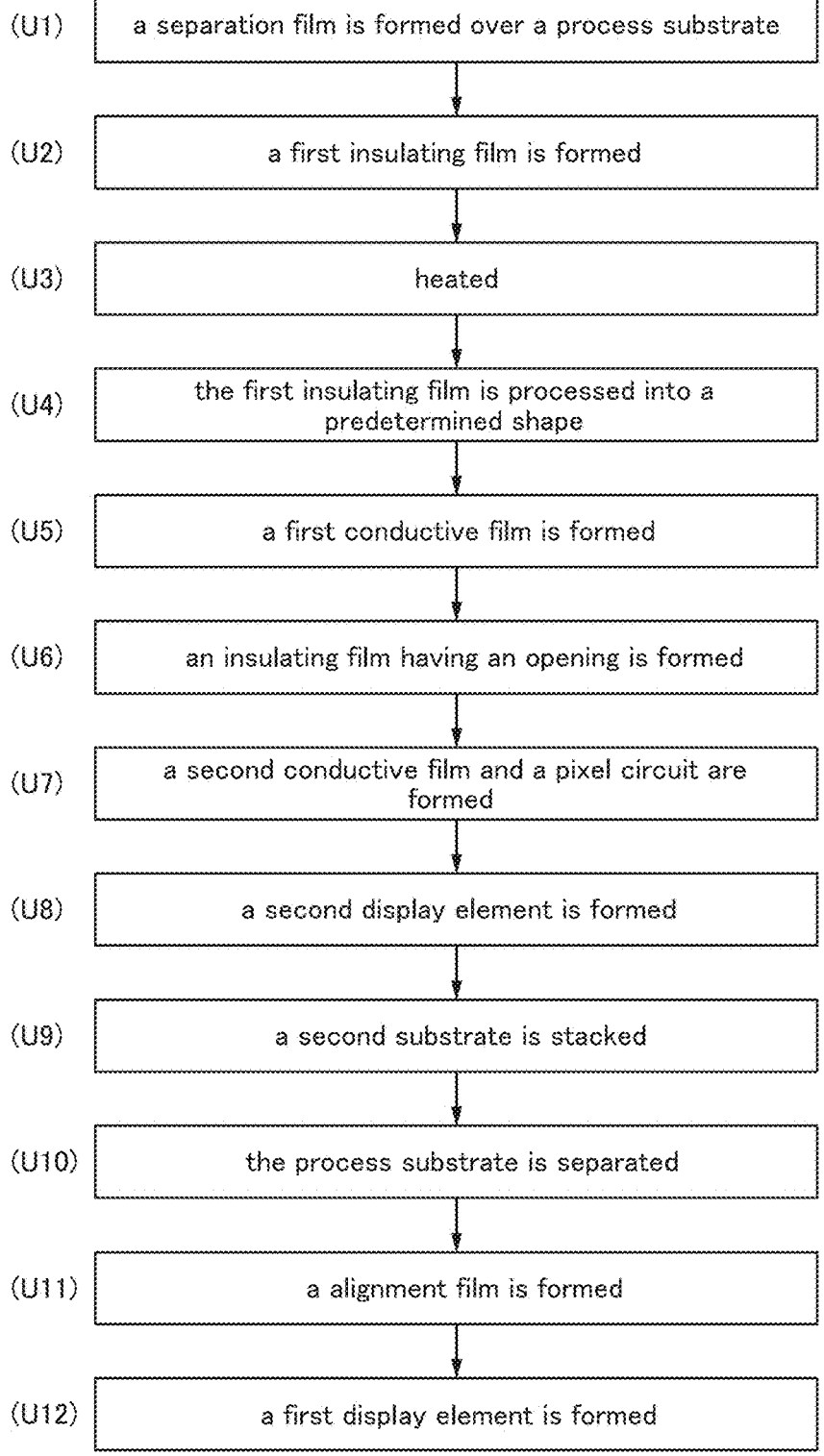

DISPLAY PANEL AND MANUFACTURING METHOD THEREOF

BACKGROUND OF THE INVENTION

1. Field of the Invention

One embodiment of the present invention relates to a display panel and a manufacturing method thereof.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, a memory device, a method for driving any of them, and a method for manufacturing any of them.

2. Description of the Related Art

There is a liquid crystal display device in which a surface-emitting light source is provided as a backlight and combined with a transmissive liquid crystal display device in order to reduce power consumption and suppress a reduction in display quality (Patent Document 1).

REFERENCE

Patent Document

[Patent Document 1] Japanese Published Patent Application No. 2011-248351

SUMMARY OF THE INVENTION

An object of one embodiment of the present invention is to provide a novel display panel that is highly convenient or reliable.

The display panel includes a pixel circuit for performing image display for each functional block and includes a driver circuit, such as a shift register circuit, a level shifter circuit, a buffer circuit, and a sampling circuit, based on a CMOS circuit. The pixel circuit and the driver circuit are preferably formed over one substrate to reduce the number of components and manufacturing cost.

Another object of one embodiment of the present invention is to provide a structure in which the width of a driver circuit of a display panel is reduced to obtain a narrower bezel.

Note that the descriptions of these objects do not disturb the existence of other objects. In one embodiment of the present invention, there is no need to achieve all the objects. Other objects will be apparent from and can be derived from the description of the specification, the drawings, the claims, and the like.

A display device of one embodiment of the present invention is configured to be driven in two display modes: a reflective display mode and a light-emitting display mode. The display device in the light-emitting display mode performs display by transmitting light from a light-emitting element overlapping with a second opening in a pixel electrode of a reflective display element through the second opening. A switching element of the reflective display element and a switching element electrically connected to the light-emitting element are formed over one substrate. They are each a transistor whose channel formation region is formed in a silicon-containing film, specifically a polysilicon film.

One embodiment of the present invention is a display panel including a driver circuit, a signal line electrically connected to the driver circuit, and a pixel. The pixel is electrically connected to the signal line. The pixel includes a first display element, a first conductive film, a second conductive film, an insulating film, a pixel circuit, and a second display element. The first conductive film is electrically connected to the first display element. The second conductive film includes a region overlapping with the first conductive film. The insulating film includes a region between the second conductive film and the first conductive film. The insulating film includes a first opening. The second conductive film is electrically connected to the first conductive film in the first opening. The pixel circuit is electrically connected to the second conductive film. The pixel circuit is electrically connected to the signal line. The pixel circuit includes a transistor. The transistor includes silicon.

A transistor used here includes a crystalline semiconductor film (typically, a polysilicon film, a microcrystalline silicon film, or the like) over an insulating surface, which serves as an active layer. Gate electrodes above and below an active layer of the transistor in the driver circuit can increase on-state current. The transistor including a polysilicon film achieves high field-effect mobility and high reliability. In the case of using a polysilicon film, a p-channel transistor and an n-channel transistor can be formed over one substrate through selective doping of dopants, so that a CMOS circuit with a complementary combination of the transistors can be formed. Thus, an area occupied by the driver circuit can be reduced.

Voltages are applied to liquid crystals to drive a pixel portion which includes a capacitor and a pixel transistor serving as a switching element of a display panel. Since liquid crystals need to be driven with an alternating current, a method called frame inversion driving has been employed in many cases. Thus, the transistor characteristic of a sufficiently low off-state current (Ioff: the value of a drain current flowing when a transistor is off) is required. However, it has been pointed out that a transistor including a polysilicon film has disadvantages of a low drain withstand voltage and a large off-state current.

In order to solve this problem, a lightly doped drain (LDD) structure including a low-concentration impurity region (LDD region) (a structure where the low-concentration impurity region is provided between a channel formation region and a source region or a drain region to which an impurity element is added at a high concentration) is employed. Alternatively, an offset region in contact with the channel formation region may be provided. The offset region means a region whose impurity concentration is equal to that of the channel formation region and which does not overlap with a gate electrode.

A transistor of a driver circuit of one embodiment of the present invention includes a first insulating layer over a first conductive film, a semiconductor layer including a channel formation region over the first insulating layer, a second insulating layer over the semiconductor layer, and a second conductive film over the second insulating layer. The second conductive film covers side surfaces of the semiconductor layer with the second insulating layer provided therebetween. The semiconductor layer is surrounded by the first conductive film and the second conductive film in a cross section in a channel width direction.

The first conductive film and the second conductive film may be electrically connected to each other and have the same potential. In this case, in the cross section in the channel width direction, the left, right, top, and bottom sides of the semiconductor layer are electrically (i.e., by an electric field) surrounded by the plurality of conductive films whose potentials are the same. The gate electrodes above and below the active layer of the transistor also serve as an electrical shield for suppressing the influence of external voltages on the channel formation region. This is particularly effective when different display elements are provided above and below a transistor. A plurality of conductive films serves as light-blocking films as well.

In the transistor of a driver circuit of one embodiment of the present invention, the second conductive film functioning as a gate electrode has a function of electrically (i.e., by an electric field) surrounding side surfaces of a semiconductor film in a cross section in a channel width direction. With this structure, on-state current of the transistor can be increased. Such a transistor structure is referred to as a surrounded channel (s-channel) structure. Note that in the s-channel structure, current flows in the whole (bulk) of the semiconductor film. Specifically, in the case where an n-channel transistor, that is, an accumulation-type transistor, is used, bulk current flows when the impurity density in a channel formation region is lower than or equal to Nd ($=1E15$ $cm^{-3}$) (Nd is activated dopant density). Even in the case where a p-channel transistor, that is, an inversion-type transistor, is used, bulk current flows when the impurity density is lower than or equal to Nd ($=1E15$ $cm^{-3}$). Since current flows in an inner part of the semiconductor film, the current is hardly affected by interface scattering, and high on-state current can be obtained. In addition, by making the semiconductor film thick, on-state current can be increased. In addition, with the s-channel structure, an excellent S value can be obtained. The relationship between the drain current and the gate voltage at around Vth or lower is also referred to as subthreshold characteristics, which are important to determine the performance of the transistor as a switching element. As a constant representing the subthreshold characteristics, a subthreshold swing (hereinafter abbreviated to an S value) is used. As the S value is smaller, the transistor can operate at high speed with low power consumption.

In the case where an amorphous silicon film is irradiated with laser light to be a polycrystalline silicon film and the polycrystalline silicon film is used for the channel formation region of the transistor, the grain boundary formed by irradiating with laser light reaches below the polycrystalline silicon film; thus, a larger amount of current flows in the bulk of the semiconductor film as compared with at the interface of the semiconductor film. Therefore, with the s-channel structure, an adverse effect of variations in irradiation energy of the laser light can be reduced.

However, in the transistor of a driver circuit of one embodiment of the present invention, a gate electric field is applied to the oxide semiconductor film not only in the vertical direction but also from the side surfaces. That is, the gate electric field is applied to the whole of the semiconductor film, whereby current flows in the bulk of the semiconductor film. It is thus possible to increase the field-effect mobility of the transistor. Variations of impurities also influence the whole of the bulk; therefore, a change in the electrical characteristics can be suppressed with the s-channel structure.

Furthermore, the application of the s-channel structure to a transistor in a driver circuit can reduce the channel width W, so that the area of the driver circuit can be reduced. For example, the width of the driver circuit is reduced to 0.5 mm, preferably 0.3 mm, resulting in a narrower bezel. Although the area of the driver circuit is shielded from light, the driver circuit might be slightly exposed to external light when the distance between a pixel and the driver circuit is reduced with the reduction in bezel.

The novel display panel described in this specification can be used outdoors. The s-channel structure where a channel formation region is surrounded by a metal film is advantageous in blocking external light and thus can reduce photo deterioration of a driver circuit of the novel display panel due to outdoor use.

A transistor of a pixel circuit of an active matrix display device may have the s-channel structure. The application of the s-channel structure to a transistor serving as a constant current source in an organic EL element is particularly effective because the deterioration can be suppressed.

One embodiment of the present invention can provide a novel display panel that is highly convenient or reliable.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

FIGS. 1A, 1B1, 1B2, and 1C are top views illustrating the structure of a display panel of according to one embodiment.

FIGS. 4A, 4B1, and 4B2 are top views illustrating the structure of a display panel according to one embodiment.

FIGS. 5A, 5B, and 5C are a top view and cross-sectional views illustrating one embodiment of the present invention;

FIGS. 6A, 6B, and 6C are a top view and cross-sectional views illustrating one embodiment of the present invention.

FIG. 11 is a flow chart illustrating a method for manufacturing a display panel according to one embodiment.

DETAILED DESCRIPTION OF THE INVENTION

The display panel of one embodiment of the present invention includes a first display element, a first conductive film electrically connected to the first display element, a second conductive film including a region overlapping with the first conductive film, an insulating film including a region between the second conductive film and the first conductive film, a pixel circuit electrically connected to the second conductive film, and a second display element electrically connected to the pixel circuit. The insulating film includes a first opening. The second conductive film is electrically connected to the first conductive film through the first opening.

Thus, the first display element and the second display element that displays an image using a method different from that of the first display element can be driven using pixel circuits that can be formed in the same process. Thus, the novel display panel that is highly convenient or reliable can be provided.

Embodiments of the present invention will be described below in detail with reference to the drawings. Note that the present invention should not be limited to the following description. It is easily understood by those skilled in the art that modes and details disclosed herein can be modified in various ways. Furthermore, the present invention should not be construed as being limited to description of the embodiments and the examples.

Embodiment 1

FIGS. 1A, 1B1, and 1B2 illustrate the structure of a display panel 700 of one embodiment of the present invention. FIG. 1A is a bottom view of the touch panel 700 of one embodiment of the present invention. FIG. 1B1 is a bottom view illustrating part of FIG. 1A. FIG. 1B2 is a bottom view omitting some components illustrated in FIG. 1B1. FIG. 1C is atop view of an example where a display portion has a circular shape.

Figures 2A, 2B:
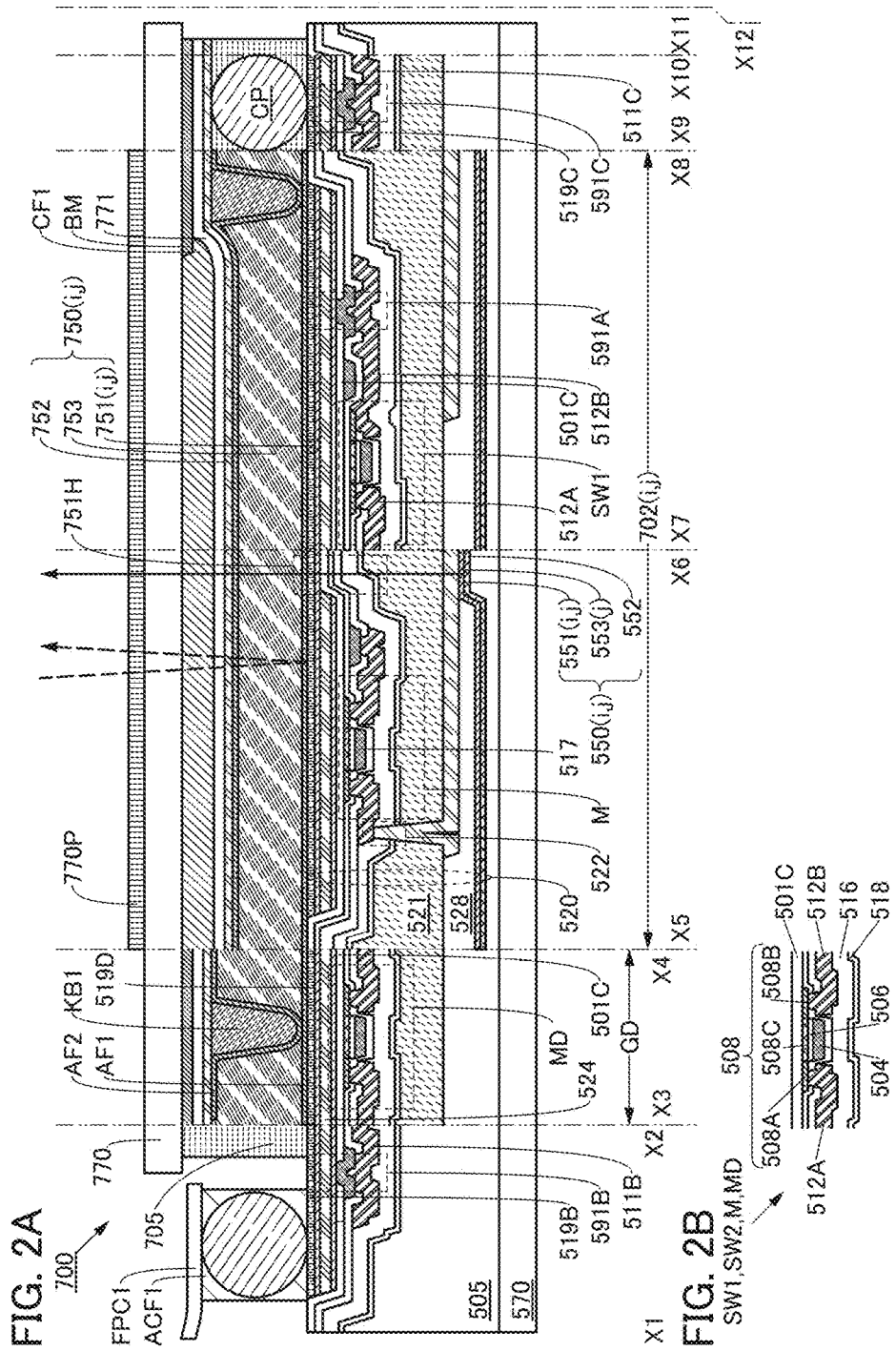
FIGS. 2A and 2B are cross-sectional views illustrating the structure of a display panel according to one embodiment.

FIGS. 2A and 2B illustrate the structures of the display panel 700 of one embodiment of the present invention. FIG. 2A is a cross-sectional view taken along section lines X1-X2, X3-X4, X9-X10, and X11-X12 shown in FIG. 1A and section lines X5-X6 and X7-X8 shown in FIG. 1B. FIG. 2B is a cross-sectional view illustrating part of the display panel.

Figure 3:
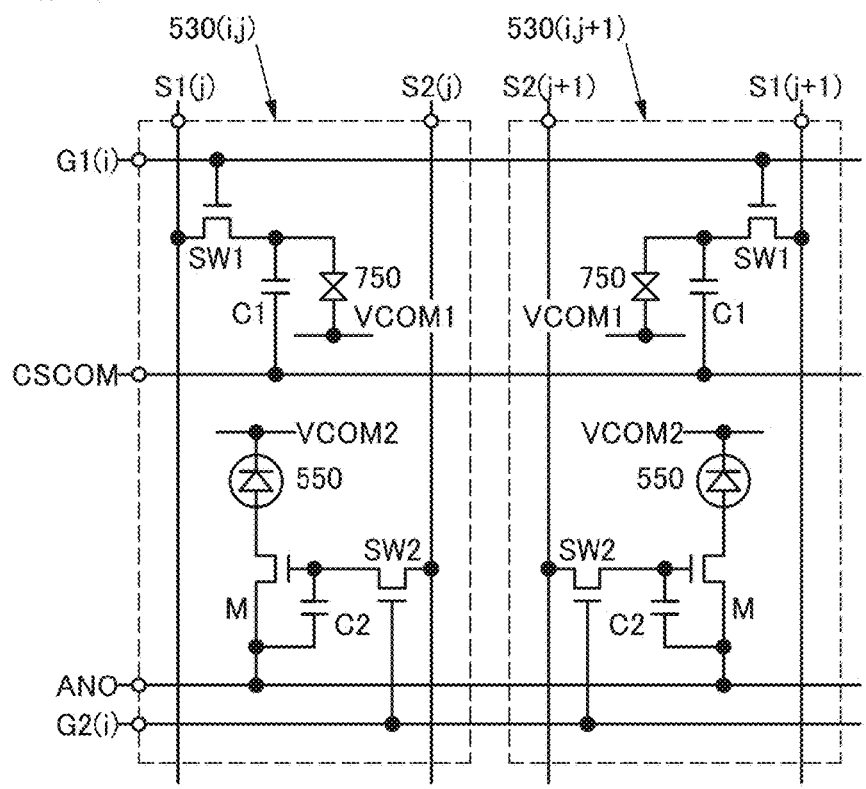
FIG. 3 is a circuit diagram illustrating a pixel circuit according to one embodiment.

FIG. 3 illustrates the structure of the display panel 700, which is one embodiment of the present invention. FIG. 3 is a circuit diagram of a pixel circuit 530(i,j) and a pixel circuit 530(i,j+1) which can be used as pixel circuits of the display panel 700, which is one embodiment of the present invention.

FIGS. 4A, 4B1, and 4B2 illustrate the structure of the display panel 700, which is one embodiment of the present invention. FIG. 4A is a block diagram illustrating arrangement of pixels, wirings, or the like which can be used for the display panel 700 of one embodiment of the present invention. FIGS. 4B1 and 4B2 are schematic views illustrating arrangement of openings 751H which can be used for the display panel 700 of one embodiment of the present invention.

Structure Example 1 of Display Panel

The display panel 700 described in this embodiment includes a signal line S1(j) and a pixel 702(i,j)(see FIGS. 1B1 and 1B2).

The pixel 702(i,j) is electrically connected to the signal line S1(j).

The pixel 702(i,j) includes a first display element 750(i,j), a first conductive film, a second conductive film, an insulating film 501C, the pixel circuit 530(i,j), and a second display element 550(i,j)(see FIG. 2A and FIG. 3). Although the example of a top-gate transistor is illustrated, the present invention is not limited thereto. For example, a bottom-gate transistor can be used.

The first conductive film is electrically connected to the first display element 750(i,j)(see FIG. 2A). For example, the first conductive film can be used for the first display element 750(i,j) and the first electrode 751(i,j).

The second conductive film has a region overlapping with the first conductive film. For example, the second conductive film can be used as a conductive film 512B serving as a source electrode or a drain electrode of a transistor which can be used as a switch SW1. Note that the conductive films 504, 512A, and 512B are covered with the insulating films 516 and 518.

The second insulating film 501C has a region between the second conductive film and the first conductive film.

The pixel circuit 530(i,j) is electrically connected to the second conductive film. For example, the transistor in which the second conductive film is used as the conductive film 512B serving as a source electrode or a drain electrode can be used as the switch SW1 of the pixel circuit 530(i,j) (see FIG. 2A and FIG. 3).

The second display element 550(i,j) is electrically connected to the pixel circuit 530(i,j).

The second insulating film 501C includes an opening 591A (see FIG. 2A).

The second conductive film is electrically connected to the first conductive film in the opening 591A. For example, the conductive film 512B is electrically connected to the first electrode 751(i,j) which also serves as the first conductive film.

The pixel circuit 530(i,j) is electrically connected to the signal line S1(j) (see FIG. 3). Note that the conductive film 512A is electrically connected to the signal line S1(j) (see FIG. 2A and FIG. 3).

The first electrode 751(i,j) has an edge portion embedded in the second insulating film 501C.

The pixel circuit 530(i,j) of the display panel described in this embodiment includes the switch SW1. The switch SW1 includes a transistor which contains silicon.

The second display element 550(i,j) of the display panel described in this embodiment is configured to perform display in the same direction as any of display directions of the first display element 750(i,j). For example, a dashed arrow in the drawing denotes the direction in which the first display element 750(i,j) performs display by controlling the intensity of external light reflection. In addition, a solid arrow in the drawing denotes the direction in which the second display element 550(i,j) performs display (see FIG. 2A).

In addition, the second display element 550(i,j) of the display panel described in this embodiment is configured to display in a region surrounded by a region where the first display element 750(i,j) performs display (see FIG. 4B1 or 4B2). Note that the first display element 750(i,j) performs display in a region overlapping with the first electrode 751(i,j) and that the second display element 550(i,j) performs display in a region overlapping with the opening 751H.

The first display element 750(i,j) of the display panel described in this embodiment includes a reflective film which reflects incident light and is configured to control the intensity of the reflected light. The reflective film has the opening 751H. Note that the first conductive film, the first electrode 751(i,j), or the like can be used as the reflective film of the first display element 750(i,j).

The second display element 550(i,j) has a function of emitting light toward the opening 751H.

The display panel described in this embodiment includes the pixel 702(i,j), one pixel group consisting of pixels 702(i,1) to 702(i,n), the other pixel group consisting of pixels 702(1,j) to 702(m,j), and a scan line G1(i) (see FIG. 4A). Note that i is an integer greater than or equal to 1 and less than or equal to m, j is an integer greater than or equal to 1 and less than or equal to n, and each of m and n is an integer greater than or equal to 1.

The display panel described in this embodiment includes a scan line G2(i), a wiring CSCOM, and a wiring ANO.

The one pixel group consisting of the pixels 702(i,1) to 702(i,n) includes the pixel 702(i,j). The pixels 702(i,1) to 702(i,n) are arranged in a row direction (indicated by an arrow R in the drawing).

The other pixel group consisting of the pixels 702(1,j) to 702(m,j) includes the pixel 702(i,j). The pixels 702(1,j) to 702(m,j) are arranged in a column direction (indicated by an arrow C in the drawing) intersecting with the row direction.

The scan line G1(i) is electrically connected to the pixels 702(i,1) to 702(i,n) of the one pixel group arranged in the row direction.

The signal line S1(j) is electrically connected to the pixels 702(1,j) to 702(m,j) of the other pixel group arranged in the column direction.

For example, the pixel 702(i,j) adjacent to the pixel 702(i,j+1) in the row direction includes an opening in a position different from that of the opening 751H in the pixel 702(i,j+1) (see FIG. 4B1).

For example, the pixel 702(i+1,j) adjacent to the pixel 702(i,j) in the column direction includes an opening in a position different from that of the opening 751H in the pixel 702(i,j)(see FIG. 4B2). Note that the first electrode 751(i,j) can be used as the reflective film.

In addition, the display panel described in this embodiment includes a terminal 519B and a conductive film 511B (see FIG. 2A).

The second insulating film 501C has a region between the terminal 519B and the conductive film 511B. In addition, the second insulating film 501C includes an opening 591B.

The terminal 519B is electrically connected to the conductive film 511B in the opening 591B. In addition, the conductive film 511B is electrically connected to the pixel circuit 530(i,j). Note that for example, when the first electrode 751(i,j) or the first conductive film is used as the reflective film, a surface serving as a contact with the terminal 519B is oriented in the same direction as a surface of the first electrode 751(i,j) facing light incident to the first display element 750(i,j).

As a result, power or signals can be supplied to the pixel circuit through the terminal. Thus, a novel display panel which is highly convenient or reliable can be provided.

In addition, the first display element 750(i,j) of the display panel described in this embodiment includes a layer 753 containing a liquid-crystal material, the first electrode 751 (i,j), and a second electrode 752. Note that the second electrode 752 is provided so that an electric field for controlling the alignment of the liquid crystal material is generated between the second electrode 752 and the first electrode 751(i,j).

In addition, the display panel described in this embodiment includes an alignment film AF1 and an alignment film AF2. The alignment film AF2 is provided so that the layer 753 containing a liquid crystal material lies between the alignment films AF1 and AF2.

In addition, the second display 550(i,j) of the display panel described in this embodiment includes a third electrode 551(i,j), a fourth electrode 552, and a layer 553(j) containing a light-emitting organic compound.

The fourth electrode 552 has a region overlapping with the third electrode 551(i,j). The layer 553(j) containing a light-emitting organic compound lies between the third electrode 551 and the fourth electrode 552. The third electrode 551(i,j) is electrically connected to the pixel circuit 530(i,j) in a contact portion 522.

In addition, the pixel 702(i,j) of the display panel described in this embodiment includes a coloring film CF1, a light blocking film BM, an insulating film 771, and a functional film 770P.

The coloring film CF1 has a region overlapping with the first display element 750(i,j). The light blocking film BM has an opening in a region overlapping with the first display element 750(i,j).

The insulating film 771 lies between the layer 753 containing a liquid crystal material and the coloring film CF1 or between the layer 753 containing a liquid crystal material and the light blocking film BM. Thus, unevenness due to the thickness of the coloring film CF1 can be avoided. Impurities can be prevented from being diffused from the light blocking film BM, the coloring film CF1, or the like to the layer 753 containing a liquid crystal material.

The functional film 770P has a region overlapping with the first display element 750(i,j). The functional film 770P is provided so that a substrate 770 lies between the functional film 770P and the first display element 750(i,j).

In addition, the display panel described in this embodiment includes a substrate 570, the substrate 770, and a functional layer 520.

The substrate 770 has a region overlapping with the substrate 570. The functional layer 520 lies between the substrates 570 and 770.

The functional layer 520 includes the pixel circuit 530(i,j), the second display element 550(i,j), an insulating film 521, and an insulating film 528.

The insulating film 521 lies between the pixel circuit 530(i,j) and the second display element 550(i,j).

The insulating film 528 lies between the insulating film 521 and the substrate 570 and has an opening in a region overlapping with the second display element 550(i,j). The insulating film 528 along the edge of the third electrode 551 can avoid a short circuit between the third electrode 551 and the fourth electrode.

The display panel described in this embodiment includes a bonding layer 505, a sealant 705, and a structure body KB1.

The bonding layer 505 lies between the functional layer 520 and the substrate 570 to bond them together.

The sealant 705 lies between the functional layer 520 and the substrate 770 to bond them together.

The structure body KB1 is provided for making a predetermined gap between the functional layer 520 and the substrate 570.

In addition, the display panel described in this embodiment includes a terminal 519C, a conductive film 511C, and a conductor CP.

The second insulating film 501C has a region between the terminal 519C and the conductive film 511C. In addition, the second insulating film 501C has an opening 591C.

The terminal 519C is electrically connected to the conductive film 511C in the opening 591C. In addition, the conductive film 511C is electrically connected to the pixel circuit 530($i,j$).

The conductor CP lies between the terminal 519C and the second electrode 752 for electrically connecting them. For example, a conductive particle can be used as the conductor CP.

In addition, the display panel described in this embodiment includes a driver circuit GD and a driver circuit SD (see FIGS. 1A and 4A).

The driver circuit GD is electrically connected to the scan line G1($i$). The driver circuit GD includes a transistor MD, for example. Specifically, a transistor which can be formed in the same step as the transistor included in the pixel circuit 530($i,j$) can be used as the transistor MD (see FIG. 2A). Note that gate electrodes are provided above and below a channel formation region of the transistor MD. In other words, the channel formation region is sandwiched by the conductive films 519D and 517. A preferable structure is one where gate electrodes are provided above and below a channel formation region of at least one transistor of the driver circuit SD, such as an S-channel structure.

The driver circuit SD is electrically connected to the signal line S1($j$). The driver circuit SD is electrically connected to a terminal using a conductive material, for example. The terminal can be formed in the same step as the terminal 519B or the terminal 519C.

Individual components of the display panel will be described below. Note that these components cannot be clearly distinguished and one component may serve as another one or include part of another one.

For example, the first conductive film can be used as the first electrode 751($i,j$). The first conductive film can be used as a reflective film.

In addition, the second conductive film can be used as the conductive film 512B serving as a source electrode or a drain electrode of a transistor.

Structure Example 1

The display panel of one embodiment of the present invention includes the substrate 570, the substrate 770, the structure body KB1, and the sealant 705 or the bonding layer 505.

In addition, the display panel of one embodiment of the present invention includes the functional layer 520, the insulating film 521, and the insulating film 528.

In addition, the display panel of one embodiment of the present invention includes the signal line S1($j$), the signal line S2($j$), the scan line G1($i$), the scan line G2($i$), the wiring CSCOM, and the wiring ANO.

In addition, the display panel of one embodiment of the present invention includes the first conductive film and the second conductive film.

In addition, the display panel of one embodiment of the present invention includes the terminal 519B, the terminal 519C, and the conductive film 511B or the conductive film 511C.

In addition, the display panel of one embodiment of the present invention includes the pixel circuit 530($i,j$) and the switch SW1.

In addition, the display panel of one embodiment of the present invention includes the first display element 750($i,j$), the first electrode 751($i,j$), the reflective film, the opening 751H, the layer 753 containing a liquid crystal material, and the second electrode 752.

In addition, the display panel of one embodiment of the present invention includes the alignment film AF1, the alignment film AF2, the coloring film CF1, the light blocking film BM, the insulating film 771, and the functional film 770P.

In addition, the display panel of one embodiment of the present invention includes the second display element 550($i,j$), the third electrode 551($i,j$), and the fourth electrode 552 or the layer 553($j$) containing a light-emitting organic compound.

Furthermore, the display panel of one embodiment of the present invention includes the second insulating film 501C.

In addition, the display panel of one embodiment of the present invention includes the driver circuit GD or the driver circuit SD.

<<Substrate 570>>

The substrate 570 or the like can be formed using a material having heat resistance high enough to withstand heat treatment in the manufacturing process. Specifically, a 0.7-mm-thick non-alkali glass can be used.

For example, a large-sized glass substrate having any of the following sizes can be used as the substrate 570: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured.

For the substrate 570 or the like, an organic material, an inorganic material, a composite material of an organic material and an inorganic material, or the like can be used. For example, an inorganic material such as glass, ceramics, or a metal can be used for the substrate 570 or the like.

Specifically, non-alkali glass, soda-lime glass, potash glass, crystal glass, quartz, sapphire, or the like can be used for the substrate 570 or the like. Specifically, an inorganic oxide film, an inorganic nitride film, or the like can be used for the substrate 570 or the like. For example, silicon oxide, silicon nitride, an alumina film, or the like can be used for the substrate 570 or the like. Stainless steel, aluminum, or the like can be used for the substrate 570 or the like.

For example, a single crystal semiconductor substrate or a polycrystalline semiconductor substrate of silicon or silicon carbide, a compound semiconductor substrate of silicon germanium, or an SOI substrate can be used as the substrate 570 or the like. Thus, a single crystal semiconductor element can be formed over the substrate 570 or the like.

For example, a flexible substrate formed with an organic material, such as a resin film or plastic, can be used for the substrate 570 or the like. Specifically, a resin film, a resin plate, or a stack of polyester, polyolefin, polyamide (e.g., nylon or aramid), polyimide, polyurethane, polycarbonate, an epoxy resin, an acrylic resin, a resin having a siloxane bond, or the like can be used for the substrate 570 or the like.

Specifically, polyethylene terephthalate (PET), polyethylene naphthalate (PEN), polyethersulfone (PES), acrylic, or the like can be used for the substrate 570 or the like. A stretchable elastomer with Young's modulus from 0.1 MPa to 10 MPa, such as a silicone resin, can be used for the substrate 570. Instead of a silicone resin, the stretchable material can be acrylic rubber, a thermoplastic elastomer, or the like.

Alternatively, paper, wood, or the like can be used for the substrate 570 or the like.

For example, a flexible substrate can be used as the substrate 570 or the like.

For example, a composite material, such as a resin film to which a metal plate, a thin glass plate, or an inorganic film is bonded can be used for the substrate 570 or the like. For example, a composite material formed by dispersing a fibrous or particulate metal, glass, an inorganic material, or the like into a resin film can be used for the substrate 570 or the like. For example, a composite material formed by dispersing a fibrous or particulate resin, organic material, or the like into an inorganic material can be used for the substrate 570 or the like.

A single-layer material or a stacked-layer material in which a plurality of layers are stacked can be used for the substrate 570 or the like. For example, a stacked-layer material in which a substrate, an insulating film that prevents diffusion of impurities contained in the substrate, and the like are stacked can be used for the substrate 570 or the like. Specifically, a stacked-layer material in which glass and one or a plurality of films that prevent diffusion of impurities contained in the glass and that are selected from a silicon oxide layer, a silicon nitride layer, a silicon oxynitride layer, and the like are stacked can be used for the substrate 570. Alternatively, a stacked-layer material in which a resin and a film for preventing diffusion of impurities that penetrate the resin, such as a silicon oxide film, a silicon nitride film, or a silicon oxynitride film, are stacked can be used for the substrate 570 or the like.

Note that a transistor, a capacitor, or the like can be directly formed on the substrate. Alternatively, a transistor, a capacitor, or the like can be formed over a process substrate having heat resistance and can be transferred to the substrate 570 or the like. Thus, a transistor, a capacitor, or the like can be formed over a flexible substrate, for example.

<<Substrate 770>>

For example, a light-transmitting material can be used for the substrate 770. Specifically, a material that can be used for the substrate 570 can be used for the substrate 770. Specifically, a non-alkali glass which is polished to have a thickness of approximately 0.7 mm or 0.1 mm can be used. The application of flexible substrates to the substrates 770 and 570 can provide a flexible display device.

<<Structure Body KB1>>

For example, an organic material, an inorganic material, or a composite material of an organic material and an inorganic material can be used for the structure body KB1 or the like. Thus, components between which the structure body KB1 or the like is provided can have a predetermined gap.

Specifically, for the structure body KB1 or the like, polyester, polyolefin, polyamide, polyimide, polycarbonate, polysiloxane, an acrylic resin, or the like, or a composite material of a plurality of kinds of resins selected from these can be used. Alternatively, a photosensitive material may be used.

<<Sealant 705>>

For the sealant 705 or the like, an inorganic material, an organic material, a composite material of an inorganic material and an organic material, or the like can be used.

For example, an organic material such as a thermally fusible resin or a curable resin can be used for the sealant 705 or the like.

For the sealant 705 or the like, an organic material such as a reactive curable adhesive, a photo-curable adhesive, a thermosetting adhesive, and/or an anaerobic adhesive can be used.

Specifically, an adhesive containing an epoxy resin, an acrylic resin, a silicone resin, a phenol resin, a polyimide resin, an imide resin, a polyvinyl chloride (PVC) resin, a polyvinyl butyral (PVB) resin, or an ethylene vinyl acetate (EVA) resin, or the like can be used for the sealant 705 or the like.

<<Bonding Layer 505>>

For example, a material which can be used for the sealant 705 can be used for the bonding layer 505.

<<Insulating Film 521>>

For example, an insulating inorganic material, an insulating organic material, or an insulating composite material containing an inorganic material and an organic material can be used for the insulating film 521 or the like.

Specifically, an inorganic oxide film, an inorganic nitride film, an inorganic oxynitride film, or a material obtained by stacking any of these films can be used as the insulating film 521 or the like. For example, a film including a silicon oxide film, a silicon nitride film, a silicon oxynitride film, and an aluminum oxide film, or a film including a material stacking any of these films can be used as the insulating film 521 or the like.

Specifically, polyester, polyolefin, polyamide, polyimide, polycarbonate, polysiloxane, an acrylic resin, or a stacked or composite material including resins selected from these, or the like can be used for the insulating film 521 or the like. Alternatively, a photosensitive material may be used.

Thus, steps due to components overlapping with the insulating film 521, for example, can be covered so that a flat surface can be formed.

<<Insulating Film 528>>

For example, a material which can be used for the insulating film 521 can be used for the insulating film 528. Specifically, a 1-μm-thick film containing polyimide can be used for the insulating film 528.

<<Second Insulating Film 501C>>

For example, the material which can be used for the insulating film 521 can be used for the second insulating film 501C. Specifically, a material containing silicon and oxygen can be used for the second insulating film 501C. Thus, impurity diffusion into the pixel circuit or the second display element can be suppressed.

For example, a 200-nm-thick film containing silicon, oxygen, and nitrogen can be used as the second insulating film 501C.

Note that the second insulating film 501C includes the openings 591A, 591B, and 591C.

<<Wiring, Terminal, Conductive Film>>

A conductive material can be used for a wiring or the like. Specifically, the conductive material can be used for the signal line S1($j$), the signal line S2($j$), the scan line G1($i$), the scan line G2($i$), the wiring CSCOM, the wiring ANO, the terminal 519B, the terminal 519C, the conductive film 511B, the conductive film 511C, or the like.

For example, an inorganic conductive material, an organic conductive material, a metal material, a conductive ceramic material, or the like can be used for the wiring or the like.

Specifically, a metal element selected from aluminum, gold, platinum, silver, copper, chromium, tantalum, titanium, molybdenum, tungsten, nickel, iron, cobalt, palladium, and manganese, or the like can be used for the wiring or the like. Alternatively, an alloy containing any of the above-described metal elements, or the like can be used for the wiring or the like. In particular, an alloy of copper and manganese is suitably used in microfabrication with the use of a wet etching method.

Specifically, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, or the like can be used for the wiring or the like.

Specifically, a conductive oxide such as indium oxide, indium tin oxide, indium zinc oxide, zinc oxide, or zinc oxide to which gallium is added can be used for the wiring or the like.

Specifically, a film containing graphene or graphite can be used for the wiring or the like.

For example, a film containing graphene oxide is formed and is reduced, so that a film containing graphene can be formed. As a reducing method, a method using heat, a method using a reducing agent, or the like can be employed.

Specifically, a conductive high molecule can be used for the wiring or the like.

<<First Conductive Film, Second Conductive Film>>

For example, the material which can be used for the wiring or the like can be used for the first conductive film or the second conductive film.

The first electrode 571(i,j), the wiring, or the like can be used for the first conductive film.

The conductive film 512B, the wiring, or the like of the transistor which can be used as the switch SW1 can be used as the second conductive film.

<<Pixel Circuit 530(i,j)>>

The pixel circuit 530(i,j) is electrically connected to a signal line S1(j), a signal line S2(j), a scan line G1(i), a scan line G2(i), the wiring CSCOM, and the wiring ANO (see FIG. 3).

The pixel circuit 530(i,j+1) is electrically connected to a signal line S1(j+1), a signal line S2(j+1), a scan line G1(i), a scan line G2(i), the wiring CSCOM, and the wiring ANO.

In the case where a voltage of a signal supplied to the signal line S2(j) is different from a voltage of a signal supplied to the signal line S1(j+1), the signal line S1(j+1) is positioned apart from the signal line S2(j). Specifically, the signal line S2(j+1) is positioned adjacent to the signal line S2(j).

The pixel circuit 530(i,j) includes the switch SW1, a capacitor C1, a switch SW2, a transistor M, and a capacitor C2.

For example, a transistor including a gate electrode electrically connected to the scan line G1(i) and a first electrode electrically connected to the signal line S1(j) can be used as the switch SW1.

The capacitor C1 includes a first electrode electrically connected to a second electrode of the transistor used for the switch SW1 and a second electrode electrically connected to the wiring CSCOM.

For example, a transistor including a gate electrode electrically connected to the scan line G2(i) and a first electrode electrically connected to the signal line S2(j) can be used for the switch SW2.

The transistor M includes a gate electrode electrically connected to a second electrode of the transistor used for the switch SW2 and a first electrode electrically connected to the wiring ANO.

Note that a transistor including a conductive film provided such that a semiconductor film is interposed between a gate electrode and the conductive film can be used as the transistor M. For example, a conductive film electrically connected to the wiring capable of supplying a potential equal to that supplied to the first electrode of the transistor M can be used.

The capacitor C2 includes a first electrode electrically connected to the second electrode of the transistor used for the switch SW2 and a second electrode electrically connected to the first electrode of the transistor M.

Note that the first electrode and the second electrode of the first display element 750 are electrically connected to the second electrode of the switch SW1 and the wiring VCOM1, respectively. With such a structure, the first display element 750 can be driven. The first display element 750 is a display element driven in a reflective display mode in low power consumption by utilizing external light. The higher the intensity of external light is, the better the display quality in the reflective display mode becomes.

The first electrode and the second electrode of the second display element 550 are electrically connected to the second electrode of the transistor M and the wiring VCOM2, respectively. With such a structure, the second display element 550 can be driven. The second display element 550 is a display element driven in a light-emitting display mode, which is effective in performing display indoors where light is not sufficient.

Users of the display device can select the reflective display mode or the light-emitting display mode as appropriate. Alternatively, an optical sensor may be provided to the display device so that the reflective display mode and the light-emitting display mode can be automatically switched in accordance with the ambient brightness.

<<Switch SW1, Switch SW2, Transistor M, Transistor MD>>

For example, a bottom-gate transistor, a top-gate transistor, or the like can be used as the switch SW1, the switch SW2, the transistor M, the transistor MD, or the like.

The transistor which can serve as the switch SW1 includes the semiconductor film 508 and the conductive film 504 which includes a region overlapping with the semiconductor film 508 (see FIG. 2B). The transistor which can serve as the switch SW1 includes the conductive film 512A and the conductive film 512B.

Note that the conductive film 504 and the insulating film 506 serve as a gate electrode and a gate insulating film, respectively. The conductive film 512A has one of a function as a source electrode and a function as a drain electrode, and the conductive film 512B has the other.

A conductive film in which a 10-nm-thick film containing tantalum and nitrogen and a 300-nm-thick film containing copper are stacked in this order can be used as the conductive film 504.

A material in which a 400-nm-thick film containing silicon and nitrogen and a 200-nm-thick film containing silicon, oxygen, and nitrogen are stacked in this order can be used for the insulating film 506.

A 25-nm-thick film containing indium, gallium, and zinc can be used as the semiconductor film 508.

A conductive film in which a 50-nm-thick film containing tungsten, a 400-nm-thick film containing aluminum, and a 100-nm-thick film containing titanium are stacked in this order can be used as the conductive film 512A or 512B.

<<First Display Element 750(i,j)>>

For example, a display element having a function of controlling transmission or reflection of light can be used as the first display element 750(i,j) or the like. For example, a combined structure of a polarizing plate and a liquid crystal element, a MEMS shutter display element, or an electronic paper display device can be used. The MEMS shutter display element includes a micromechanical mirror, for example. The micromechanical mirror includes a mirror surface, a first substrate to which the mirror surface is fixed by a torsion bar, a second substrate facing the first substrate, and a core made of a magnetic substance on a surface of the second substrate on the first substrate side. Electromagnetic force generated in the core brings the mirror surface into a rotation resonance state. A static actuator or an electromagnetic actuator can be used for bringing the mirror surface into the rotation resonance state. The use of such a reflective display element can reduce power consumption of a display panel by utilizing external light. Specifically, a reflective liquid crystal display element can be used as the first display element 750.

The liquid crystal element used here can be driven by any of the following driving methods: an in-plane switching (IPS) mode, a twisted nematic (TN) mode, a fringe field switching (FFS) mode, an axially symmetric aligned microcell (ASM) mode, an optically compensated birefringence (OCB) mode, a ferroelectric liquid crystal (FLC) mode, an antiferroelectric liquid crystal (AFLC) mode, and the like.

The liquid crystal element used here can be driven also by a vertical alignment (VA) mode such as a multi-domain vertical alignment (MVA) mode, a patterned vertical alignment (PVA) mode, an electrically controlled birefringence (ECB) mode, a continuous pinwheel alignment (CPA) mode, or an advanced super view (ASV) mode.

For example, thermotropic liquid crystal, low-molecular liquid crystal, high-molecular liquid crystal, polymer dispersed liquid crystal, ferroelectric liquid crystal, or antiferroelectric liquid crystal can be used. Alternatively, a liquid crystal material which exhibits a cholesteric phase, a smectic phase, a cubic phase, a chiral nematic phase, an isotropic phase, or the like can be used. Alternatively, a liquid crystal material which exhibits a blue phase can be used.

Although a reflective liquid crystal element is used in the example here, an electronic paper display device including an electrophoretic element or a twisting ball may be employed.

<<First Electrode 751(i,j)>>

For example, the material of the wiring or the like can be used for the first electrode 751(i,j). Specifically, a reflective film can be used for the first electrode 751(i,j).

<<Reflective Film>>

For example, a material reflecting visible light can be used as the reflective film. Specifically, a material containing silver can be used for the reflective film. For example, a material containing silver and palladium or a material containing silver and copper can be used.

The reflective film reflects light which passes through the layer 753 containing a liquid crystal material. This allows the first display element 750 to serve as a reflective liquid crystal element. Alternatively, a material with an uneven surface can be used for the reflective film. In that case, incident light can be reflected in various directions so that a white image can be displayed.

Note that other structures may be used as the reflective film without limitation to the first electrode 751(i,j). For example, a structure in which the reflective film lies between the layer 753 containing a liquid crystal material and the first electrode 751(i,j), or a structure in which the first electrode 751(i,j) having light-transmitting properties lies between the reflective film and the layer 753 containing a liquid crystal material can be used.

<<Opening 751H>>

If the ratio of the total area of the opening 751H to the total area except for the opening is too large, display performed using the first display element 750(i,j) is dark. If the ratio of the total area of the opening 751H to the total area except for the opening is too small, display performed using the second display element 550(i,j) is dark.

If the area of the opening 751H in the reflective film is too small, light emitted from the second display element 550 is not efficiently extracted for display.

The opening 751H may have a polygonal shape, a quadrangular shape, an elliptical shape, a circular shape, a cross-like shape, a stripe shape, a slit-like shape, or a checkered pattern, for example. The opening 751H is provided close to preferably a pixel emitting light of the same color, in which case an undesired phenomenon in which light emitted from the second display element 550 enters a coloring film of the adjacent pixel, which is called cross talk, can be suppressed.

<<Second Electrode 752>>

For example, a material having a visible-light transmitting property and conductivity can be used for the second electrode 752.

For example, a conductive oxide, a metal film thin enough to transmit light, or a metal nanowire can be used as the second electrode 752.

Specifically, a conductive oxide containing indium, a metal thin film whose thickness is more than or equal to 1 nm and less than or equal to 10 nm, or a metal nanowire containing silver can be used for the second electrode 752.

Specifically, indium oxide, indium tin oxide, indium zinc oxide, zinc oxide, zinc oxide to which gallium is added, zinc oxide to which aluminum is added, or the like can be used for the second electrode 752.

<<Alignment Films AF1 and AF2>>

For example, the alignment films AF1 and AF2 can be formed with a material containing polyimide or the like, such as a material formed to have a predetermined alignment by a rubbing process or an optical alignment process.

For example, a film containing soluble polyimide can be used as the alignment film AF1 or AF2.

<<Coloring Film CF1>>

The coloring film CF1 can be formed using a material transmitting light of a predetermined color and can thus be used as a color filter or the like.

For example, the coloring film CF1 can be formed with a material transmitting light of blue, green, red, yellow, or white.

<<Light-Blocking Film BM>>

The light-blocking film BM can be formed with a material that prevents light transmission and can thus be used as a black matrix, for example.

<<Insulating Film 771>>

The insulating film 771 can be formed with polyimide, epoxy resin, acrylic resin, or the like.

<<Functional Film 770P>>

For example, a polarizing plate, a retardation plate, a diffusing film, an anti-reflective film, a condensing film, or the like can be used as the functional film 770P. Alternatively, a polarizing plate containing a dichromatic pigment can be used for the functional film 770P.

Alternatively, an antistatic film preventing the attachment of a foreign substance, a water repellent film suppressing the attachment of stain, a hard coat film suppressing generation of a scratch in use, or the like can be used for the functional film 770P.

<<Second Display Element 550(i,j)>>

A light-emitting element, for example, can be used as the second display element 550(i,j). Specifically, an organic electroluminescence element, an inorganic electroluminescence element, a light-emitting diode, or the like can be used for the second display element 550(i,j).

For example, a stack body for emitting blue light, green light, or red light can be used as the layer 553(j) containing a light-emitting organic compound.

For example, a stack body extending linearly in the row direction along the signal line S1(j) can be used for the layer 553(j) containing a light-emitting organic compound. A stack body extending linearly in the row direction along the signal line S1(j+1) emitting light of a different color from the layer 553(j) containing a light-emitting organic compound can be used for the layer 553(j+1) containing a light-emitting organic compound.

For example, a stack body for emitting white light can be used as the layer 553(j) containing a light-emitting organic compound and the layer 553(j+1) containing a light-emitting organic compound. Specifically, a stack of a layer containing a light-emitting organic material containing a fluorescent material that emits blue light, a layer containing a material that is other than a fluorescent material and that emits green light and/or red light, or a layer containing a material that is other than a fluorescent material and that emits yellow light can be used as the layer 553(j) containing a light-emitting organic compound and the layer 553(j+1) containing a light-emitting organic compound.

For example, a material which can be used for the wiring or the like can be used for the third electrode 551(i,j) or the fourth electrode 552.

For example, a material which transmits visible light and can be used for the wiring or the like can be used for the third electrode 551(i,j).

Specifically, conductive oxide, indium-containing conductive oxide, indium oxide, indium tin oxide, indium zinc oxide, zinc oxide, zinc oxide to which gallium is added, or the like can be used for the third electrode 551(i,j). Alternatively, a metal film that is thin enough to transmit light can be used as the third electrode 551(i,j).

For example, a material which reflects visible light and can be used for the wiring or the like can be used for the fourth electrode 552.

<<Driver Circuit GD>>

Any of a variety of sequential circuits, such as a shift register, can be used as the driver circuit GD. For example, the transistor MD, a capacitor, and the like can be used in the driver circuit GD. Specifically, a transistor that can be formed over the substrate where the transistor M is formed can be used.

A transistor whose structure is different from the transistor which can be used as the switch SW1 can be used as the transistor MD. Specifically, a transistor including the conductive film 524 overlapping with the channel formation region can be used as the transistor MD.

The insulating film 501C is provided between the conductive film 524 and the semiconductor film 508. The insulating film 506 is provided between the semiconductor film 508 and the conductive film 504. For example, the conductive film 524 is electrically connected to a wiring supplying the same potential as that supplied to the conductive film 504.

<<Driver Circuit SD>>

For example, an integrated circuit can be used in the driver circuit SD. Specifically, an integrated circuit formed on a silicon substrate can be used as the driver circuit SD.

For example, a chip on glass (COG) method can be used to mount the driver circuit SD on a pad electrically connected to the pixel circuit 530(i,j). Specifically, an anisotropic conductive film can be used to mount the integrated circuit on the pad.

Note that the pad can be formed in the same step as the terminal 519B or 519C.

Embodiment 2

FIG. 5B is a cross-sectional view (in a channel length direction) of an example of an n-channel transistor including a thin polysilicon film, which is one embodiment of the present invention. FIG. 5A is a top view of a transistor 70A and FIG. 5C is a cross-sectional view of the transistor in a channel width W direction.

The transistor 70A includes, over a substrate 72 having an insulating surface, a conductive film 73 functioning as a gate, an insulating film 74 over the conductive film 73, a semiconductor film 75 overlapping with the conductive film 73 with the insulating film 74 provided therebetween, an insulating film 76 over the semiconductor film 75, a conductive film 77 overlapping with the semiconductor film 75 with the insulating film 76 provided therebetween and functioning as a gate, an insulating film 78 over the conductive film 77, an insulating film 79 over the insulating film 78, and a conductive film 80 and a conductive film 81 which are electrically connected to the semiconductor film 75 through openings in the insulating films 78 and 79 and function as a source and a drain.

The semiconductor film 75 includes a channel formation region 82 overlapping with the conductive film 77, a pair of lightly doped drain (LDD) regions 83 between which the channel formation region 82 is sandwiched, and a pair of impurity regions 84 between which the channel formation region 82 and the LDD regions 83 are sandwiched. The pair of impurity regions 84 functions as a source region and a drain region. An impurity element imparting n-type conductivity to the semiconductor film 75, such as phosphorus (P) or arsenic (As), is added to the LDD regions 83 and the impurity regions 84.

The transistor 70A includes a first insulating layer (the insulating film 74) over a first conductive layer (the conductive film 73), the semiconductor film 75 including the channel formation region 82 over the first insulating layer (the insulating film 74), a second insulating layer (the insulating film 76) over the semiconductor film 75, and a second conductive layer (the conductive film 77) over the second insulating layer (the insulating film 76). In the cross section in the channel width direction, the second conductive layer (the conductive film 77) covers side surfaces of the semiconductor film 75 with the second insulating layer (the insulating film 76) provided therebetween. In addition, the semiconductor film 75 is surrounded by the first conductive layer (the conductive film 73) and the second conductive layer (the conductive film 77); that is, the transistor 70A has an s-channel structure.

With the structure in FIG. 5C, current flows in the whole (bulk) of the semiconductor film 75. Since current flows through the semiconductor film 75, an adverse effect of interface scattering is unlikely to occur, leading to a high on-state current. Note that an increase in the thickness of the semiconductor film 75 enables the on-state current to increase.

In the transistor 70A, a gate electric field is applied to the semiconductor film 75 not only in the vertical direction but also from the lateral direction. That is, the gate electric field is applied to the whole of the semiconductor film 75, whereby current flows in the bulk of the semiconductor film 75. It is thus possible to increase the field-effect mobility of the transistor 70A. Distribution of impurities is uniform in the whole of the bulk; thus, variations in electrical characteristics can be reduced.

When the transistor has an s-channel structure, an effect of eliminating the influence of an impurity that enters to the semiconductor film from above and below is obtained as well. Moreover, the first conductive layer (the conductive film 73) and the second conductive layer (the conductive film 77) can prevent the semiconductor film 75 from being irradiated with downward and upward light to suppress photoexcitation, so that an increase in off-state current can be prevented.

Here, an example where an n-channel transistor is used is shown; however, a p-channel transistor can be fabricated if an impurity element imparting p-type conductivity to the semiconductor film 75, such as boron (B), aluminum (Al), or gallium (Ga), is added instead of the impurity element imparting n-type conductivity to the semiconductor film 75. Alternatively, an impurity element imparting p-type conductivity may be slightly added to the channel formation region 82 of the n-channel transistor 70A.

Note that the semiconductor film 75 may be crystallized by various techniques. Examples of the various techniques of crystallization are a laser crystallization method using a laser beam and a crystallization method using a catalytic element. Alternatively, a crystallization method using a catalytic element and a laser crystallization method may be used in combination. In the case of using a thermally stable substrate such as quartz for the substrate 72, any of the following crystallization methods can be used in combination: a thermal crystallization method with an electrically-heated oven, a lamp anneal crystallization method with infrared light, a crystallization method with a catalytic element, and high temperature annealing at about 950° C.

In the case where an amorphous silicon film is irradiated with laser light to be a polycrystalline silicon film and the polycrystalline silicon film is used for the channel formation region 82 of the transistor 70A, the grain boundary formed by irradiating with laser light reaches below the polycrystalline silicon film; thus, a larger amount of current flows in the bulk of the semiconductor film as compared with at the interface of the semiconductor film. Therefore, an adverse effect of variations in irradiation energy of the laser light can be reduced.

In the past, the threshold voltage has been controlled so that an impurity element is added to a channel region at a low concentration. In the case where a semiconductor layer is sandwiched between a pair of gate electrodes, there has been a problem in that the probability of generating carriers at the interface between the semiconductor layer and an insulating film is high, the carriers are injected into the insulating film and the interface between the semiconductor layer and the insulating film, and the threshold voltage is increased. In addition, from an energy band structure of the channel region, it is found that a carrier path is formed only at the interface between the semiconductor layer and the insulating film and in the vicinity of the interface. Thus, a big problem has been a reduction in mobility and drain current due to the injection of hot carriers accelerated by voltage applied to the drain into the insulating film and the interface between the insulating film and the semiconductor layer.

In the transistor 70A of one embodiment of the present invention, a gate electric field is applied to the semiconductor film not only in the vertical direction but also from the lateral direction. That is, the gate electric field is applied to the whole of the semiconductor film, whereby current flows in the bulk of the semiconductor film. It is thus possible to increase the field-effect mobility of the transistor. Distribution of impurities is uniform in the whole of the bulk; thus, variations in electrical characteristics can be reduced.

Although the structure in which the conductive film 77 functioning as a gate and the conductive film 73 functioning as a back gate electrode are included is shown in FIG. 5A, another structure may be employed. For example, depending on a circuit to be used, a transistor in which the conductive film 73 functioning as a back gate electrode is not provided may be partly provided.

In addition, as in FIG. 5A, the conductive film 77 functioning as a gate has a tapered portion. When a gate electrode having a tapered portion is used and a semiconductor layer is doped with an impurity element to form an impurity region in a self-aligned manner, a semiconductor device with less hot-carrier degradation can be achieved.

Figure 6A:
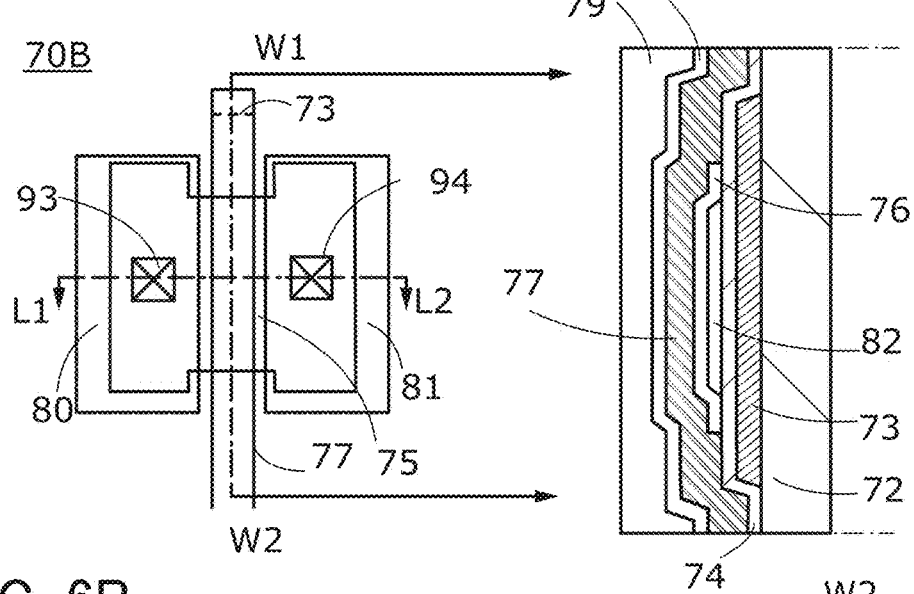

Furthermore, the example where the conductive film 77 functioning as a gate and the conductive film 73 functioning as a back gate electrode are electrically connected to each other is shown in FIG. 5A, and a structure in which the potentials thereof can be separately controlled is shown in FIG. 6A.

Figure 6B:
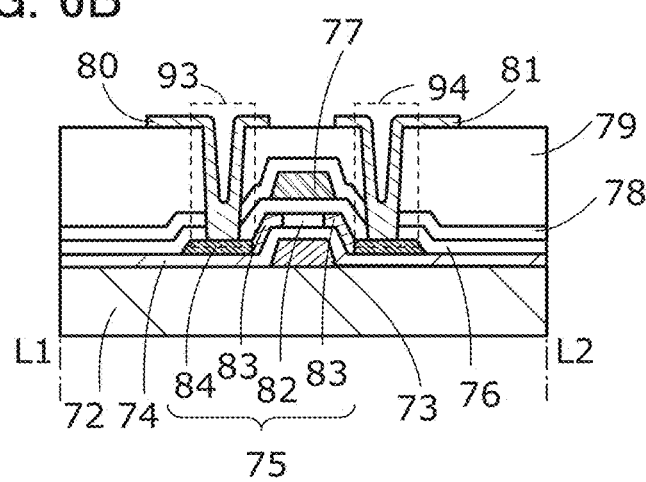

FIG. 6A is a top view of a transistor 70B. FIG. 6B is a cross-sectional view taken along line L1-L2 in the channel length direction of the transistor 70B. FIG. 6C is a cross-sectional view taken along line W1-W2 in the channel width direction of the transistor 70B.

The transistor 70B in FIG. 6B is different from the transistor 70A in FIG. 5B in the kind of the insulating film 74. FIG. 6B shows an example where an insulating film obtained by a plasma CVD method or the like is used as the insulating film 74: the surface of the insulating film has a projection because of the conductive film 73 functioning as the back gate electrode and a semiconductor film is formed over the insulating film; thus, the surface shape of the base is reflected also in the surface of the semiconductor film.

In FIG. 6C, as in FIG. 5C, an s-channel structure in which the channel formation region is surrounded by the conductive film 77 functioning as the gate and the conductive film 73 functioning as the back gate electrode is shown.

Figure 7A:
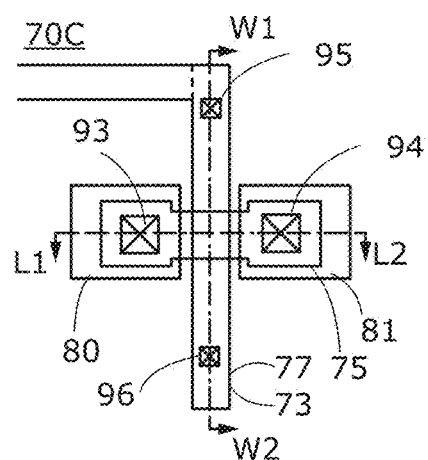
FIGS. 7A, 7B, and 7C are a top view and cross-sectional views illustrating one embodiment of the present invention.
Figure 7C:
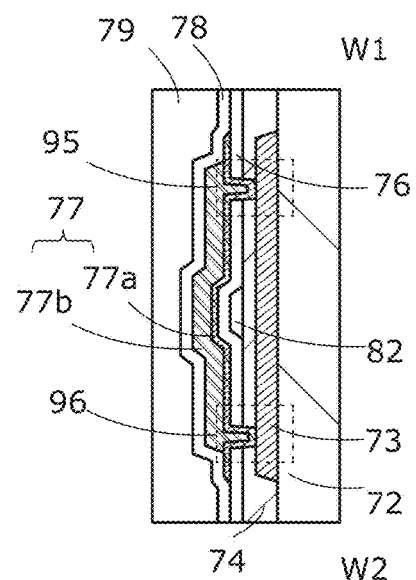
Figure 7B:
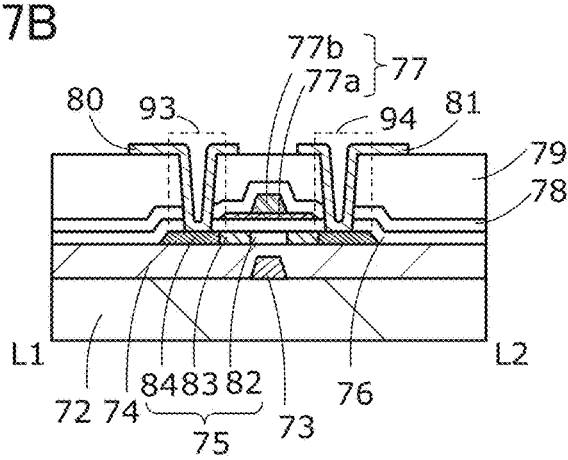

FIG. 7A is a top view of a transistor 70C. FIG. 7B is a cross-sectional view taken along line L1-L2 in the channel length direction of the transistor 70C. FIG. 7C is a cross-sectional view taken along line W1-W2 in the channel width direction of the transistor 70C.

FIG. 7A shows the conductive film 77, the conductive film 73, the semiconductor film 75, the conductive film 80, the conductive film 81, an opening 93, an opening 94, an opening 95, and an opening 96. The conductive film 77 functions as a gate. The conductive film 73 functions as a back gate. Details of the components denoted by the same reference numerals as those in FIG. 5A are omitted in the description of FIG. 7A. The openings 93 and 94 are openings for connecting the semiconductor film 75 and the conductive films 80 and 81. The openings 95 and 96 are openings for electrically connecting the conductive films 77 and 73.

FIG. 7B shows, over the substrate 72, the conductive film 73, the insulating film 74, the semiconductor film 75 overlapping with the conductive film 73 with the insulating film 74 provided therebetween, the insulating film 76 over the semiconductor film 75, conductive films 77a and 77b overlapping with the semiconductor film 75 with the insulating film 76 provided therebetween and functioning as a gate, the insulating film 78 over the conductive films 77a and 77b, the insulating film 79 over the insulating film 78, and the conductive films 80 and 81 electrically connected to the semiconductor film 75 through the openings 93 and 94 in the insulating films 78 and 79 and functioning as a source and a drain. Details of the components denoted by the same reference numerals as those in FIG. 5B are omitted in the description of FIG. 7B.

FIG. 7C shows, over the substrate 72, the conductive film 73, the insulating film 74, the channel formation region 82, the insulating film 76, the conductive film 77a and the conductive film 77b which are electrically connected to the conductive film 73 in the openings 95 and 96, the insulating film 78 over the conductive films 77a and 77b, and the insulating film 79 over the insulating film 78. The semiconductor film 75 includes the channel formation region 82, the LDD region 83, and the impurity region 84. The structure of the conductive films 77a and 77b allows doping through a region of the conductive film 77a which does not overlap with the conductive film 77b, whereby the impurity regions can be formed in a self-aligned manner. The length of the LDD region overlapping with the conductive film 77a (in the channel length direction) is determined by the conductive film 77b, which serves as a mask in the ion doping. The conductive films 77a and 77b can serve as masks in the ion doping, the LDD region overlapping with the conductive film 77a can be formed in a self-aligned manner, and the length (Lov) can be adjusted to a desired length. In addition, the length of the LDD region overlapping with the conductive film 77a can be accurately determined and the lifetime against hot-carrier degradation can be extended, so that a highly reliable semiconductor device can be manufactured with high yield.

Details of the components denoted by the same reference numerals as those in FIG. 5A are omitted in the description of FIG. 7C.

In the structure illustrated in the top view and the cross-sectional views of FIGS. 7A to 7C, the conductive film 77 functioning as a gate and the conductive film 73 electrically connected to the conductive film 77 and functioning as a back gate electrically surround the channel formation region 82 of the semiconductor film 75 in the channel width direction. In other words, in this structure, the conductive films wrap around the top surface, the bottom surface, and the side surfaces of the channel formation region. Such a structure can increase the on-state current and reduce the size in the channel width direction. Besides, such a structure that the channel formation region is surrounded by the conductive films can easily block light and thus can suppress photoexcitation caused by undesired light irradiation on the channel formation region.

In addition, the structure shown in the top view and the cross-sectional views of FIGS. 7A to 7C can avoid an electrical connection at the ends of the semiconductor film 75 in the W1-W2 direction caused by an undesired increase in conductivity. The influence of non-uniform distribution of impurity elements added to the LDD region 83 and the impurity region 84 can be reduced.

In addition, the structure illustrated in the top view and the cross-sectional views of FIGS. 7A to 7C can avoid an accidental electrical connection at the ends of the semiconductor film 75 in the W1-W2 direction caused by an undesired increase in conductivity. The influence of non-uniform distribution of the impurity element added to the semiconductor film 75 can also be reduced.

Although the structure shown in the top view and the cross-sectional view of FIGS. 7A to 7C includes a gate and a back gate electrically connected to each other, different potentials may be supplied to them as shown in FIGS. 6A to 6C, which is particularly effective in the case where all transistors in the circuit have n-channel conductivity. In such a structure, the threshold voltage of a transistor can be controlled by applying voltage to a back gate; thus, a logic circuit, such as an inverter circuit, can be formed using ED-MOS transistors whose threshold voltages are different from each other. The area occupied by a pixel driver circuit using such a logic circuit can be reduced, leading to narrowing the bezel of a display device. In addition, when the voltage of the back gate is set so that a transistor is turned off, the off-state current of the transistor can be further reduced. Therefore, even when the refresh rate of the display device is increased, written voltages can be maintained and accordingly the number of writings can be reduced, leading to low power consumption of the display device.

Figure 8A:
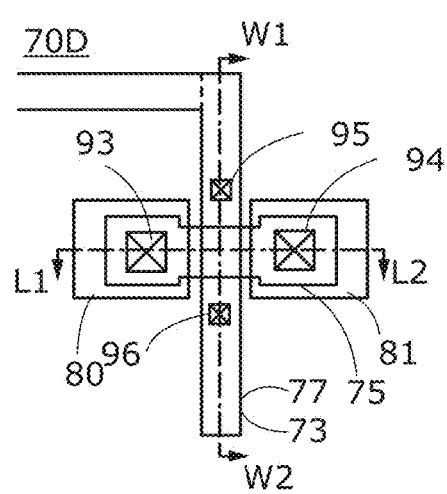
FIGS. 8A, 8B, and 8C are a top view and cross-sectional views illustrating one embodiment of the present invention.
Figure 8C:
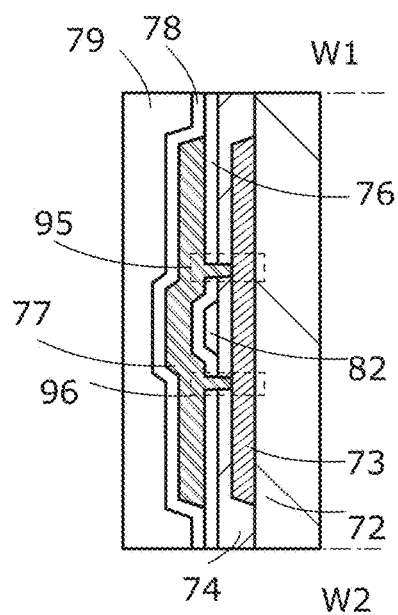
Figure 8B:
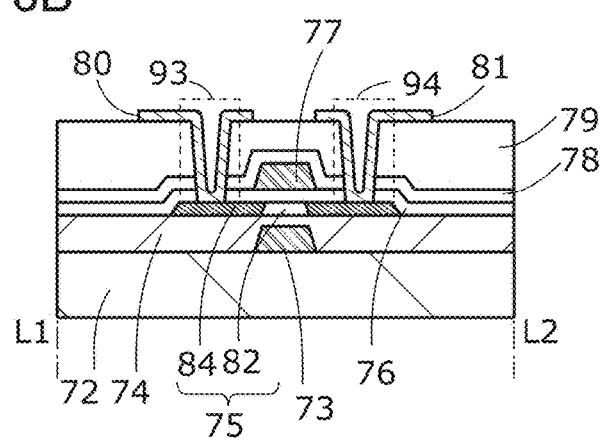

Note that the top view and the cross-sectional views of FIGS. 7A to 7C show just one example, and another structure can be employed. FIGS. 8A to 8C are a top view and cross-sectional views different from those of FIGS. 7A to 7C.

Different points of the structure shown in FIGS. 8A to 8C from the structure shown in FIGS. 7A to 7C are that the conductive film 77 functioning as a gate is a single layer and that the openings 95 and 96 are closer to the channel formation region 82. Such a structure facilitates application of electric field to the channel formation region from the top, bottom, and side surfaces of the channel formation region of a transistor 70D. Effects similar to those of the structure in FIGS. 7A to 7C can be obtained from the s-channel structure.

FIGS. 5A to 5C show a top view and cross-sectional views of a structure different from the structures shown in FIGS. 7A to 7C and FIGS. 8A to 8C.

Figure 9A:
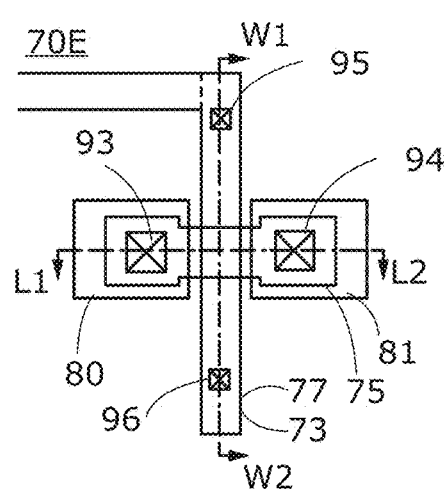
FIGS. 9A, 9B, and 9C are a top view and cross-sectional views illustrating one embodiment of the present invention.
Figure 9C:
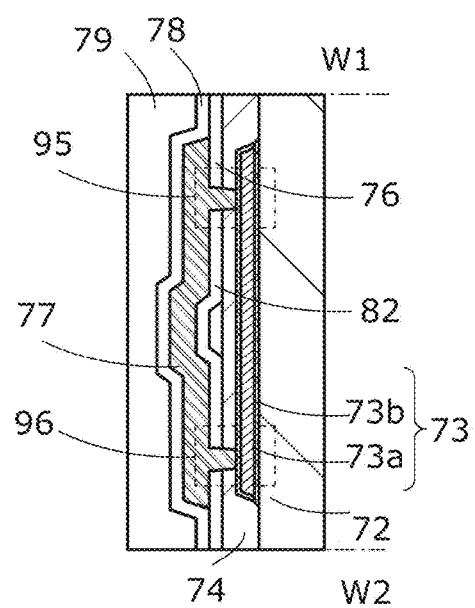
Figure 9B:
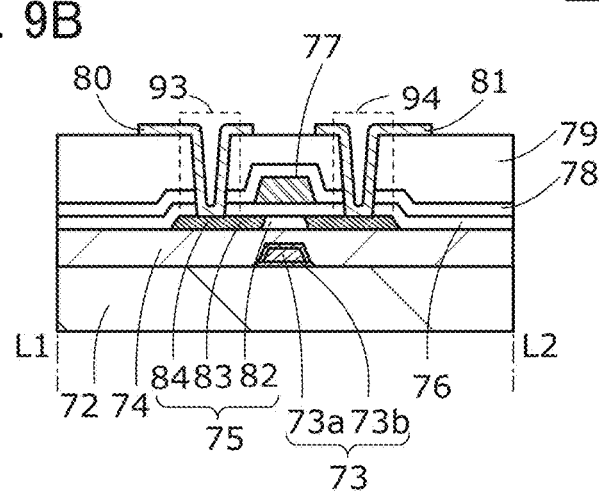

A different point of the structure shown in FIGS. 9A to 9C from the structures shown in FIGS. 7A to 7C and FIGS. 8A to 8C is that the conductive film 73 functioning as a back gate of a transistor 70E is composed of a conductive film 73a and a conductive film 73b which is surrounded by the conductive film 73a. Effects similar to those of the structure in FIGS. 7A to 7C can be obtained from the s-channel structure.

In addition, even when the conductive film 73b contains a movable element (e.g., copper (Cu)), the structure shown in FIGS. 9A to 9C can prevent the movable element from entering the semiconductor film causing degradation of the semiconductor film.

As materials of the conductive film 73a, which serves as a barrier film and provided on the formation surface of the wiring, any of tungsten (W), molybdenum (Mo), chromium (Cr), titanium (Ti), and tantalum (Ta), which are high melting point materials, an alloy thereof (e.g., W—Mo, Mo—Cr, or Ta—Mo) or a nitride thereof (e.g., tungsten nitride, titanium nitride, tantalum nitride, or $TiSiN_x$), or the like can be used. A sputtering method, a CVD method, or the like can be adopted as the formation method. As the materials of the conductive film 73b, copper (Cu) is preferable; however, there is no particular limitation as long as they are low resistance materials. For example, silver (Ag), aluminum (Al), gold (Au), an alloy thereof, or the like can be used. As the formation method of the conductive film 73b, a sputtering method is preferable; however, a CVD method can be adopted as long as conditions that do not damage the resist mask are selected.

Embodiment 3

In this embodiment, an example where an n-channel transistor 70 and a p-channel transistor 71 are provided over the same substrate is shown. When the n-channel transistor 70 and the p-channel transistor 71 are combined, a CMOS circuit or the like can be fabricated.

Figure 10A:
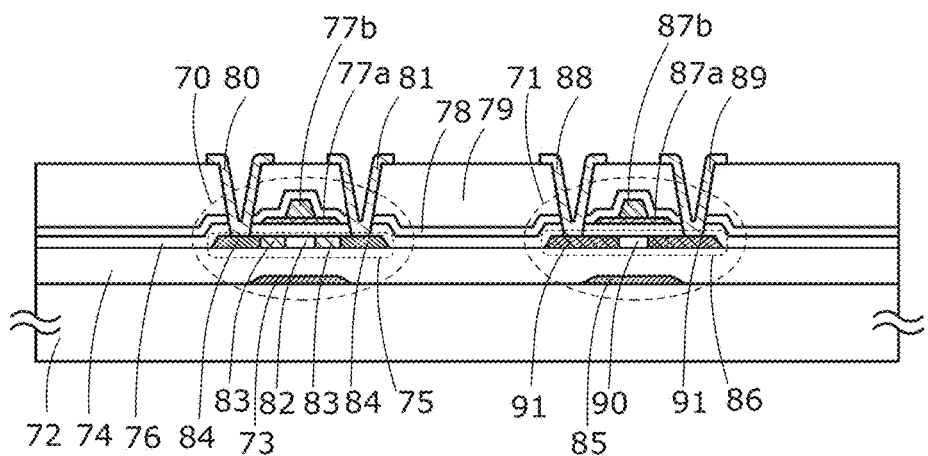
FIGS. 10A and 10B are cross-sectional views illustrating one embodiment of the present invention.
Figure 10B:
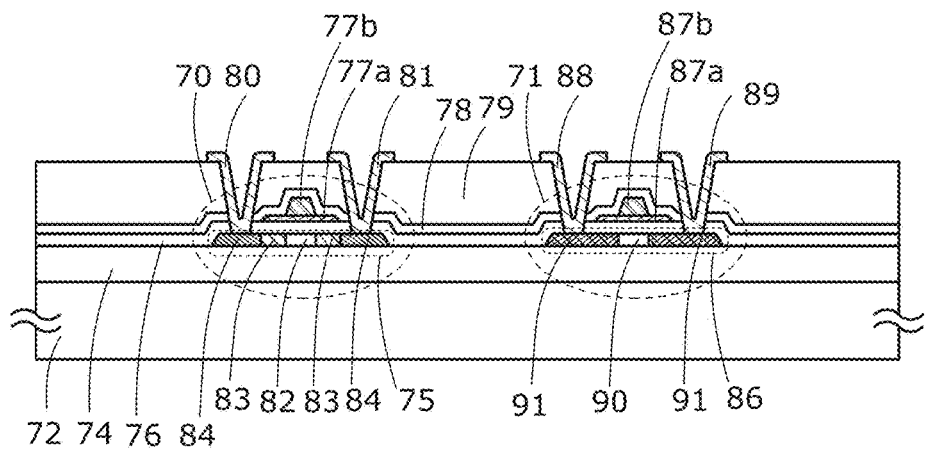

FIGS. 10A and 10B are cross-sectional views of transistors each including a thin silicon film, which can be used in the display device of one embodiment of the present invention. FIGS. 10A and 10B show n-channel transistors 70 and p-channel transistors 71.

The transistor 70 includes, over a substrate 72 having an insulating surface, a conductive film 73 functioning as a gate, an insulating film 74 over the conductive film 73, a semiconductor film 75 overlapping with the conductive film 73 with the insulating film 74 provided therebetween, an insulating film 76 over the semiconductor film 75, conductive films 77a and 77b overlapping with the semiconductor film 75 with the insulating film 76 provided therebetween and functioning as a gate, an insulating film 78 over the conductive films 77a and 77b, an insulating film 79 over the insulating film 78, and conductive films 80 and 81 electrically connected to the semiconductor film 75 through openings in the insulating films 78 and 79 and functioning as a source and a drain.

The width of the conductive film 77b in the channel length direction is shorter than that of the conductive film 77a. The conductive films 77a and 77b are stacked in this order from the insulating film 76 side. The semiconductor film 75 includes a channel formation region 82 overlapping with the conductive film 77b, a pair of lightly doped drain (LDD) regions 83 between which the channel formation region 82 is sandwiched, and a pair of impurity regions 84 between which the channel formation region 82 and the LDD regions 83 are sandwiched. The pair of impurity regions 84 serves as a source region and a drain region. An impurity element imparting n-type conductivity to the semiconductor film 75, such as phosphorus (P) or arsenic (As), is added to the LDD regions 83 and the impurity regions 84.

The transistor 71 includes, over the substrate 72 having an insulating surface, a conductive film 85 functioning as a gate, the insulating film 74 over the conductive film 85, a semiconductor film 86 overlapping with the conductive film 85 with the insulating film 74 provided therebetween, the insulating film 76 over the semiconductor film 86, conductive films 87a and 87b overlapping with the semiconductor film 86 with the insulating film 76 provided therebetween and functioning as a gate, the insulating film 78 over the conductive films 87a and 87b, the insulating film 79 over the insulating film 78, and conductive films 88 and 89 electrically connected to the semiconductor film 86 through openings in the insulating films 78 and 79 and functioning as a source and a drain.

The width of the conductive film 87b in the channel length direction is shorter than that of the conductive film 87a. The conductive films 87a and 87b are stacked in this order from the insulating film 76 side. The semiconductor film 75 includes a channel formation region 90 overlapping with the conductive film 87b and a pair of impurity regions 91 between which the channel formation region 90 is sandwiched. The pair of impurity regions 91 functions as a source region and a drain region. An impurity element imparting p-type conductivity to the semiconductor film 86, such as boron (B), aluminum (Al), or gallium (Ga), is added to the impurity regions 91.

Although FIG. 10A shows a structure in which the conductive films 77a and 77b function as a gate and the conductive film 73 functions as a back gate electrode, another structure may be employed. For example, the conductive film 73 functioning as a back gate electrode may be omitted as shown in FIG. 10B. Although FIG. 10A shows a structure in which the conductive films 87a and 87b function as a gate and the conductive film 73 functions as a back gate electrode, one embodiment of the present invention is not limited thereto. For example, the conductive film 85 functioning as a back gate electrode may be omitted as shown in FIG. 10B.

The n-channel transistor 70 in FIG. 10A has an s-channel structure as in Embodiment 2 and corresponds to the transistor 70C in FIG. 7B. A top view of the n-channel transistor 70 in FIG. 10A corresponds to the top view of the transistor 70C in FIG. 7B. A cross-sectional view in the channel width direction of the n-channel transistor 70 in FIG. 10A corresponds to the cross-sectional view of the transistor 70C in FIG. 7C.

This embodiment can be freely combined with Embodiment 2.

Embodiment 4

In this embodiment, an example of a manufacturing method of the display panel 700 which is described in Embodiment 1 is described.

FIG. 11 is a flow chart showing the manufacturing method of the display panel of one embodiment of the present invention.

<Manufacturing Method of Display Panel>

The manufacturing method of the display panel described in this embodiment is composed of the following 12 steps.
<<First Step>>

In the first step, a separation film is formed to have a region overlapping with a process substrate (see FIG. 11(U1)).

For example, a substrate over which a separation film is stacked can be used as the process substrate.

For example, a single-film material or a stacked-film material in which a plurality of films are stacked can be used for the separation film.

Specifically, an inorganic material such as a metal containing an element selected from tungsten, molybdenum, titanium, tantalum, niobium, nickel, cobalt, zirconium, zinc, ruthenium, rhodium, palladium, osmium, iridium, and silicon, an alloy containing the element, or a compound containing the element can be used for the separation film.

The film containing an oxide of tungsten can be formed on a film containing tungsten by a method in which another film is stacked on a film containing tungsten. Specifically, a film containing silicon and oxygen is stacked on the film containing tungsten. For example, the film containing silicon and oxygen is stacked on the film containing tungsten with the use of a gas containing nitrous oxide ($N_2O$).

The film containing an oxide of tungsten may be formed by subjecting a surface of a film containing tungsten to thermal oxidation treatment, oxygen plasma treatment, nitrous oxide ($N_2O$) plasma treatment, treatment with a solution with high oxidizing power (e.g., ozone water), or the like.

Specifically, a 30-nm-thick film containing tungsten having a surface subjected to plasma treatment in an atmosphere containing nitrous oxide ($N_2O$) can be used as the separation film.

<<Second Step>>

In the second step, a first insulating film is formed (see FIG. 11(U2)). Note that a material that can be separated from the substrate in a later step can be used for the first insulating film.

The first insulating film is heated in a later step to supply hydrogen. The insulating film prevents hydrogen passage. Thus, hydrogen diffuses toward the interface between the first insulating film and the separation film.

<<Third Step>>

In the third step, the first insulating film is heated (see in FIG. 11(U3)).

<<Fourth Step>>

In the fourth step, the first insulating film is processed into a predetermined shape (see FIG. 11(U4)).

The first insulating film is processed into a predetermined shape by a photolithography method and an etching method, for example.

<<Fifth Step>>

In the fifth step, a first conductive film is formed (see FIG. 11(U5)). Note that the first electrode 751(11) can be used for the first conductive film.

The first conductive film is processed into a predetermined shape by a photolithography method or an etching method, for example. Specifically, a region that reflects external light that passes through the opening 751H and enters the region is formed.

Specifically, a material obtained by stacking a 100-nm-thick conductive film 751A containing silver and a 100-nm-thick conductive film containing indium, tin, and oxygen, in this order, can be used for the first conductive film. Alternatively, a material obtained by stacking the 100-nm-thick conductive film 751A containing silver and the 100-nm-thick conductive film containing indium, tin, and oxygen, in this order, can be used for the first conductive film. Thus, a reduction in the thickness of the first conductive film in the processing of the second insulating film 501C into a desired shape can be suppressed.

<<Sixth Step>>

In the sixth step, the second insulating film 501C having the opening 591A in a region overlapping with the first conductive film is formed (see FIG. 11(U6)).

The second insulating film 501C is processed into a predetermined shape by a photolithography method and an etching method, for example.

Specifically, the second insulating film 501C with a thickness of approximately 200 nm can be used. For example, a material containing silicon and oxygen or a material containing silicon, oxygen, and nitrogen can be used for the second insulating film 501C.

Note that the second insulating film 501C has the opening 591B and the opening 591C. A conductive film including a region overlapping with the opening 591B can be used for the terminal 519B. A conductive film overlapping with the opening 591C can be used for the terminal 519C.

<<Seventh Step>>

In the seventh step, a second conductive film overlapping with the opening 591A and the pixel circuit 530($i,j$) are formed (see FIG. 11(U7)).

For example, the conductive film 512B of a transistor that can be used for the switch SW1 can be used as the second conductive film.

The first conductive film and the second conductive film can be electrically connected to each other using another conductive film including a region overlapping with the opening 591A. For example, a conductive film that can be formed in the same process as the conductive film 504 can be used as another conductive film.

<<Eighth Step>>

In the eighth step, the second display element 550($i,j$) electrically connected to the pixel circuit 530($i,j$) is formed (see FIG. 11(U8)).

<<Ninth Step>>

In the ninth step, the second substrate 570 is stacked such that the second display element 550(11) is interposed between the process substrate and the second substrate 570 (see FIG. 11(U9)).

The bonding layer 505 is formed by a printing method or a coating method, for example, and the second substrate 570 is bonded to the process substrate using the bonding layer 505.

<<Tenth Step>>

In the tenth step, the process substrate is separated (see FIG. 11(U10)).

For example, the separation film is separated from the first insulating film. Specifically, a separation starting point at which part of the first insulating film is separated from the process substrate is formed. Then, a region where part of the first insulating film is separated from the process substrate is gradually expanded from the separation starting point, so that the first insulating film is separated from the process substrate.

After the separation, the first insulating film which is now unnecessary is removed or selectively removed. In this embodiment, the first insulating film is removed to expose the conductive film overlapping with the opening 591C and the second conductive film overlapping with the opening 591A.

<<Eleventh Step>>

In the eleventh step, the alignment film AF1 is formed between the first conductive film and the layer 753 containing a liquid-crystal material (see FIG. 11(U11)).

A film containing soluble polyimide that is used as the alignment film AF1 is formed by a printing method, for example. In the case where the film containing soluble polyimide is used, the temperature of heat transferred to the second display element 550($i,j$) in formation of the alignment film AF1 can be lower than that when a method using a precursor of polyimide, such as a polyamic acid, is employed. A manufacturing method of a novel display panel that is highly convenient or reliable can be thus provided.

<<Twelfth Step>>

In the twelfth step, the first display element 750($i,j$) is formed (see FIG. 11 (U12)). The substrate 770 is bonded to the substrate 570 with the sealant 705 so that the functional layer 520 is sandwiched therebetween. The substrate 770 includes the second electrode 752 and the alignment film AF2. The substrate 570 includes the coloring film CF1, the light-blocking film BM, the insulating film 771, and the functional film 770P and is bonded to and aligned with the first display element 750($i,j$). The first display element 750($i,j$) includes the layer 753 containing a liquid crystal material, the first electrode 751($i,j$), and the second electrode 752. Note that the second electrode 752 is positioned so that an electric field which controls the alignment of the liquid crystal material is generated between the second electrode 752 and the first electrode 751($i,j$).

Note that this embodiment can be combined with any of the other embodiments in this specification as appropriate.

Embodiment 5

Figure 14:
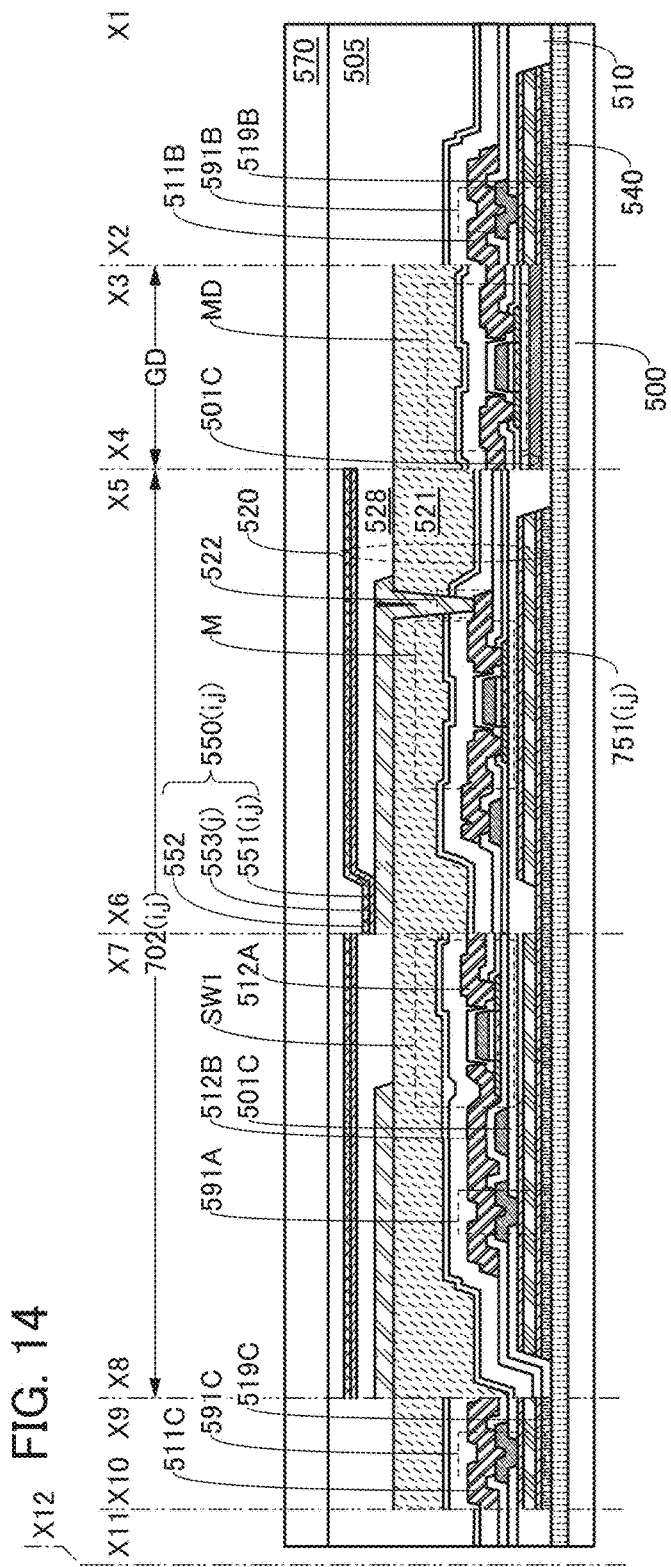
FIG. 14 is a cross-sectional view illustrating one embodiment of the present invention.

In this embodiment below, an example which is slightly different from the manufacturing method in Embodiment 4 is described. In FIG. 14, the same reference numerals are used for the same parts as those in FIGS. 2A and 2B. FIG. 14 is a cross-sectional view of a device which is midway through the manufacturing process: a stage where the functional layer 520 and the second display element 550(i,j) are formed over the substrate 500 where the separation film is formed, and the second substrate 570 is bonded thereto with the bonding layer 505.

In the example described in Embodiment 4, a substrate where a separation film formed of tungsten is stacked is used as the process substrate, whereas in an example described in this embodiment, the substrate 500 where a separation film 510 and a hydrogen-containing film 540 are stacked is used as the process substrate.

Amorphous silicon or silicon nitride is used for the hydrogen-containing film. Alternatively, an oxide semiconductor film containing a large amount of hydrogen or an oxide semiconductor film containing a large amount of nitrogen and hydrogen is used as the hydrogen-containing film.

An organic substance, such as a polyimide resin, a polyester resin, a polyolefin resin, a polyamide resin, a polycarbonate resin, or an acrylic resin, is used for the separation film 510. In particular, the polyimide resin offers resistance to high temperature (the upper temperature limit is approximately 500° C.) and thus can endure process temperatures in the following transistor process.

In this embodiment, the hydrogen-containing film 540 made from amorphous silicon is formed over the light-transmitting substrate 500, and then, the separation film 510 made from a polyimide resin is formed thereover. The amorphous silicon film may have an island shape through a selective etching. In addition, the first electrode 751(i,j) is first formed over the hydrogen-containing film, and then, the separation film made from a polyimide resin is formed in this embodiment. This is because it is preferable that the first electrode 751(i,j) be exposed after the light-transmitting substrate is separated.

The hydrogen-containing film has a role of facilitating separation at the interface between the separation film and the hydrogen-containing film in a laser irradiation process after the second display element 550(i,j) is formed and the second substrate 570 is bonded with the bonding layer 505. The separation point is not limited to the interface between the separation film and the hydrogen-containing film and can be in the hydrogen-containing film or at the interface between the hydrogen-containing film and the first electrode 751(i,j).

Through the laser irradiation process, hydrogen in the hydrogen-containing film is vaporized, so that the contact area is decreased; as a result, separation occurs.

After the substrate 500 in which the separation film and the hydrogen-containing film are stacked is used as the process substrate, the functional layer 520 and the like are formed according to Embodiment 4.

Then, the hydrogen-containing film is subjected to the laser irradiation from its substrate 500 side, so that hydrogen in the hydrogen-containing film is vaporized to cause separation. It is preferred that the laser conditions and deposition conditions of the hydrogen-containing film be adjusted so that wavelengths of laser light used in the laser irradiation process can be effectively absorbed by the hydrogen-containing film. Particularly when an oxide semiconductor film is used as the hydrogen-containing film, the deposition conditions are adjusted appropriately so that a colored film is obtained. Because the polyimide resin absorbs light from an excimer laser light source, most of the emitted laser light is absorbed, which prevents laser light irradiation to a transistor included in the functional layer 520.

If part of the hydrogen-containing film remains over the surface of the first electrode 751(i,j), the hydrogen-containing film 540 is removed by wet etching or dry etching. In the case where amorphous silicon is used for the hydrogen-containing film, dry etching with a fluorine etching gas is performed.

The reset of the process is carried out in accordance with Embodiment 4, so that a display panel can be obtained.

This embodiment is the same as Embodiment 4 except that the substrate 500 in which the separation film 510 and the hydrogen-containing film 540 are stacked is used as the process substrate. The substrate 500 is finally removed; thus, the obtained devices are almost the same.

In the example shown in this embodiment, the hydrogen-containing film 540 made from amorphous silicon is formed over the substrate 500 and the separation film 510 made from a polyimide resin is formed thereover; however, one embodiment should not be limited to the example. Alternatively, only the hydrogen-containing film may serve as the separation film; in that case, the hydrogen-containing film 540 made from amorphous silicon is formed over the substrate 500 and a light-transmitting conductive film is formed thereover.

At least part of this embodiment can be implemented in combination with any of the embodiments described in this specification as appropriate.

Embodiment 6

In this embodiment, a structure of a data processing device of one embodiment of the present invention will be described with reference to FIGS. 12A to 12D.

Figure 12A:
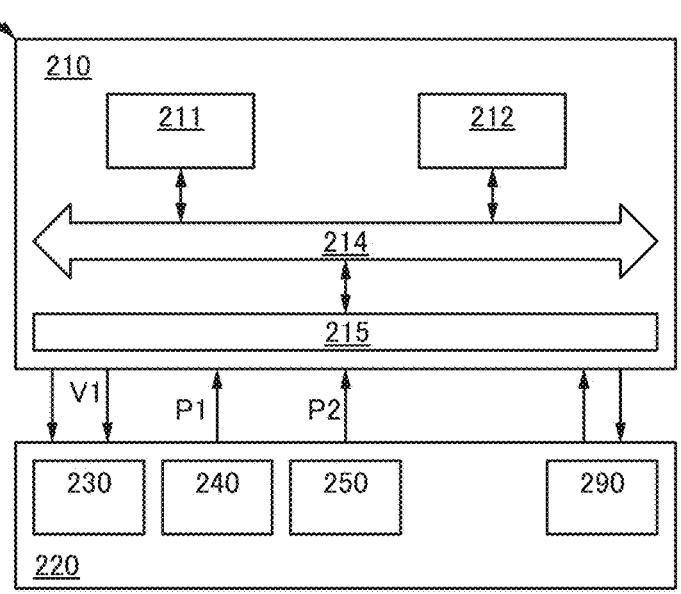
FIGS. 12A, 12B, 12C, and 12D are a block diagram and projection views illustrating the structure of a data processing device of one embodiment.
Figure 12B:
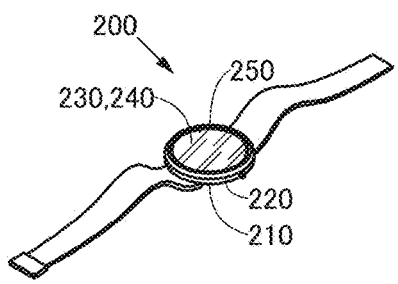

FIG. 12A is a block diagram illustrating a structure of a data processing device 200. FIGS. 12B and 12C are projection views each illustrating an example of an external view of the data processing device 200.

<Configuration Example of Data Processing Device>

The data processing device 200 described in this embodiment includes an arithmetic device 210 and an input/output device 220 (see FIG. 12A).

The arithmetic device 210 has a function of receiving positional data P1 and supplying image data V and control data.

The input/output device 220 has a function of supplying the positional data P1 and receiving the image data V and the control data.

The input/output device 220 includes the display portion 230 that displays the image data V and an input portion 240 that supplies the positional data P1.

As shown in Embodiment 1, the display portion 230 includes a first display element and a second display element overlapping with the first display element. The display portion 230 further includes a first pixel circuit for driving the first display element and a second pixel circuit for driving the second display element. The display portion 230 has two display modes: a reflective display mode and a light-emitting display mode.

The input portion 240 has a function of determining the position of a pointer and supplying the positional data P1 determined in accordance with the position.

The arithmetic device 210 has a function of determining the moving speed of the pointer in accordance with the positional data P1.

The arithmetic device 210 has a function of determining the contrast or brightness of the image data V in accordance with the moving speed.

The data processing device 200 described in this embodiment includes the input/output device 220 that supplies the positional data P1 and receives the image data V and the arithmetic device 210 that receives the positional data P1 and supplies the image data V. The arithmetic device 210 has a function of determining the contrast or brightness of the image data V in accordance with the moving speed of the positional data P1.

With this structure, eyestrain on a user caused when the display position of image data is moved can be reduced, that is, eye-friendly display can be achieved. Moreover, the power consumption can be reduced and excellent visibility can be provided even in a bright place exposed to direct sunlight, for example. Thus, the novel data processing device that is highly convenient or reliable can be provided.

<Configuration>

The data processing device of one embodiment of the present invention includes the arithmetic device 210 or the input/output device 220.

<<Arithmetic Device 210>>

The arithmetic device 210 includes an arithmetic unit 211 and a memory unit 212. The arithmetic device 210 further includes a transmission path 214 and an input/output interface 215 (see FIG. 12A).

<<Arithmetic Unit 211>>

The arithmetic unit 211 has a function of, for example, executing a program. For example, a CPU can be used.

<<Memory Unit 212>>

The memory unit 212 has a function of, for example, storing the program executed by the arithmetic unit 211, initial data, setting data, an image, or the like.

Specifically, a hard disk, a flash memory, a memory, or the like can be used.

<<Input/Output Interface 215, Transmission Path 214>>

The input/output interface 215 includes a terminal or a wiring and has a function of supplying and receiving data. For example, the input/output interface 215 can be electrically connected to the transmission path 214 and the input/output device 220.

The transmission path 214 includes a wiring and has a function of supplying and receiving data. For example, the transmission path 214 can be electrically connected to the input/output interface 215. Alternatively, the transmission path 214 can be electrically connected to the arithmetic unit 211, the memory unit 212, or the input/output interface 215.

<<Input/Output Device 220>>

The input/output device 220 includes the display portion 230, the input portion 240, a sensor portion 250, or a communication portion 290.

<<Display Portion 230>>

The display portion 230 includes a display region 231, a driver circuit GD, and a driver circuit SD. For example, the display panel described in Embodiment 1 can be used. The display panel in Embodiment 1 has two display modes: the reflective display mode and the light-emitting display mode, which can be switched appropriately.

The display region 231 includes a plurality of pixels 232($i$,1) to 232 ($i,n$) arranged in the row direction, a plurality of pixels 232(1, $j$) to 232 ($m,j$) arranged in the column direction, scan lines G1($i$) and G2($i$) electrically connected to the pixels 232($i$,1) to 232 ($i,n$), and signal lines S1($j$) and S2($j$) electrically connected to the pixels 232(1,$j$) to 232 ($m,j$). Note that i is an integer greater than or equal to 1 and less than or equal to m, j is an integer greater than or equal to 1 and less than or equal to n, and each of m and n is an integer greater than or equal to 1.

<<Driver Circuit GD>>

The driver circuit GD has a function of supplying a selection signal in accordance with the control data.

For example, the driver circuit GD has a function of supplying a selection signal to one scan line at a frequency of 30 Hz or higher, preferably 60 Hz or higher, in accordance with the control data. Accordingly, moving images can be smoothly displayed. The light-emitting display mode is suitable to smoothly display moving images.

For example, the driver circuit GD is configured to supply a selection signal to one scan line at a frequency of lower than 30 Hz, preferably lower than 1 Hz, more preferably less than once per minute, in accordance with the control information. Accordingly, a still image can be displayed while flickering is suppressed. A still image can be displayed in the reflective display mode with low power consumption. Particularly when an electronic paper device is used as a reflective display element in the reflective display mode, once a still image is displayed, the display can be kept with little power consumption.

For example, in the case where a plurality of driver circuits is provided, the driver circuits GDA and GDB may supply the selection signals at different frequencies. Specifically, the selection signal can be supplied at a higher frequency to a region on which moving images are smoothly displayed than to a region on which a still image is displayed in a state where flickering is suppressed.

<<Driver Circuit SD>>

The driver circuit SD is configured to supply an image signal in accordance with the image information V.

<<Pixel Circuit>>

A pixel circuit including a circuit having a function of driving the first display element or the second display element can be used.

For example, a switch, a transistor, a diode, a resistor, an inductor, a capacitor can be used in the pixel circuit.

For example, one or a plurality of transistors can be used for a switch. Alternatively, a plurality of transistors connected in parallel, in series, or in combination of parallel connection and series connection can be used for a switch.

<<Input Portion 240>>

Any of a variety of human interfaces or the like can be used as the input portion 240 (see FIG. 12A).

For example, a keyboard, a mouse, a touch sensor, a microphone, a camera, or the like can be used as the input portion 240. Note that a touch sensor having a region overlapping with the display portion 230 can be used. An input/output device that includes the display portion 230 and a touch sensor overlapping with the display portion 230 can be referred to as a touch panel.

For example, a user can make various gestures (e.g., tap, drag, swipe, and pinch in) using his/her finger as a pointer on the touch panel.

The arithmetic device 210, for example, analyzes data on the position, track, or the like of the finger on the touch panel and determines that a specific gesture is supplied when the analysis results meet predetermined conditions. Therefore, the user can supply a certain operation instruction associated with a predetermined gesture by using the gesture.

For instance, the user can supply a "scrolling instruction" for changing a portion where image data is displayed by using a gesture of touching and moving his/her finger on the touch panel.

<<Sensor Portion 250>>

The sensor portion 250 has a function of acquiring data P2 by determining the surrounding state.

For example, a camera, an acceleration sensor, a direction sensor, a pressure sensor, a temperature sensor, a humidity sensor, an illuminance sensor, or a global positioning system (GPS) signal receiving circuit can be used as the sensor portion 250.

For example, when the arithmetic device 210 determines that the ambient light level measured by an illuminance sensor of the sensor portion 250 is sufficiently higher than the predetermined illuminance, image data is displayed using the first display element 750. When the arithmetic device 210 determines that it is dim, image data is displayed using the first display element 750 and the second display element 550. When the arithmetic device 210 determines that it is dark, image data is displayed using the second display element 550.

Specifically, an image is displayed with a liquid crystal element and an organic EL element in accordance with the ambient brightness.

Thus, image data can be displayed in such a manner that, for example, a reflective display element is used under strong ambient light and a self-luminous display element is used in dim light. Thus, a novel data processing device which has low power consumption and is highly convenient or reliable can be provided.

For example, a sensor having a function of determining the chromaticity of ambient light, such as a CCD camera, can be used in the sensor portion 250, whereby white balance can be adjusted in accordance with the chromaticity of ambient light determined by the sensor portion 250.

Specifically, in the first step, disruption of white balance of ambient light is detected.

In the second step, the intensity of light of a color which is insufficient in an image to be displayed by the first display element using reflection of ambient light is estimated.

In the third step, ambient light is reflected by the first display element, and light is emitted from the second display element so that light of the insufficient color is supplemented, whereby the image is displayed.

In this manner, display can be performed with adjusted white balance by utilizing light reflected by the first display element and light emitted from the second display element. Thus, a novel data processing device which can display an image with low power consumption or with adjusted white balance and which is highly convenient and reliable can be provided.

<<Communication Portion 290>>

The communication portion 290 has a function of supplying and acquiring data to/from a network.

<<Predetermined Event>>

A variety of instructions can be associated with a variety of events.

The following instructions can be given as examples: "page-turning instruction" for switching displayed image data from one to another and "scroll instruction" for moving the display position of part of image data and displaying another part continuing from that part.

For example, the following events can be used: events supplied using a pointing device such as a mouse (e.g., "click" and "drag") and events supplied to a touch panel with a finger or the like used as a pointer (e.g., "tap", "drag", and "swipe").

For example, the position of a slide bar pointed by a pointer, the swipe speed, and the drag speed can be used as parameters assigned to assigned to various instructions.

Specifically, a parameter that determines the page-turning speed or the like can be used to execute the "page-turning instruction," and a parameter that determines the moving speed of the display position or the like can be used to execute the "scroll instruction."

For example, the display brightness, contrast, or saturation may be changed in accordance with the page-turning speed and/or the scroll speed.

Specifically, in the case where the page-turning speed and/or the scroll speed are/is higher than the predetermined speed, the display brightness may be decreased in synchronization with the speed.

Alternatively, in the case where the page-turning speed and/or the scroll speed are/is higher than the predetermined speed, the contrast may be decreased in synchronization with the speed.

For example, the speed at which user's eyes cannot follow displayed images can be used as the predetermined speed.

The contrast can be reduced in such a manner that the gray level of a bright region (with a high gray level) included in image data is brought close to the gray level of a dark region (with a low gray level) included in the image data.

Alternatively, the contrast can be reduced in such a manner that the gray level of the dark region included in image data is brought close to the gray level of the bright region included in the image data.

Specifically, in the case where the page-turning speed and/or the scroll speed are/is higher than the predetermined speed, display may be performed such that the yellow tone is increased or the blue tone is decreased in synchronization with the speed.

Image data may be generated based on the usage ambience of the data processing device acquired by the sensor portion 250. For example, user's favorite color can be used as the background color of the image data in accordance with the acquired ambient brightness or the like (see FIG. 12B).

Image data may be generated in accordance with received data delivered to a specific space using the communication portion 290. For example, educational materials can be fed from a classroom of, for example, a school or a university and displayed to be used as a schoolbook. Alternatively, materials distributed from a conference room in, for example, a company can be received and displayed (see FIG. 12C).

Thus, favorable environment can be provided for a user of the data processing device 200.

<<Application>>

Figure 12D:
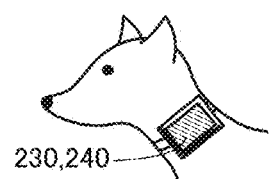
Figure 12C:
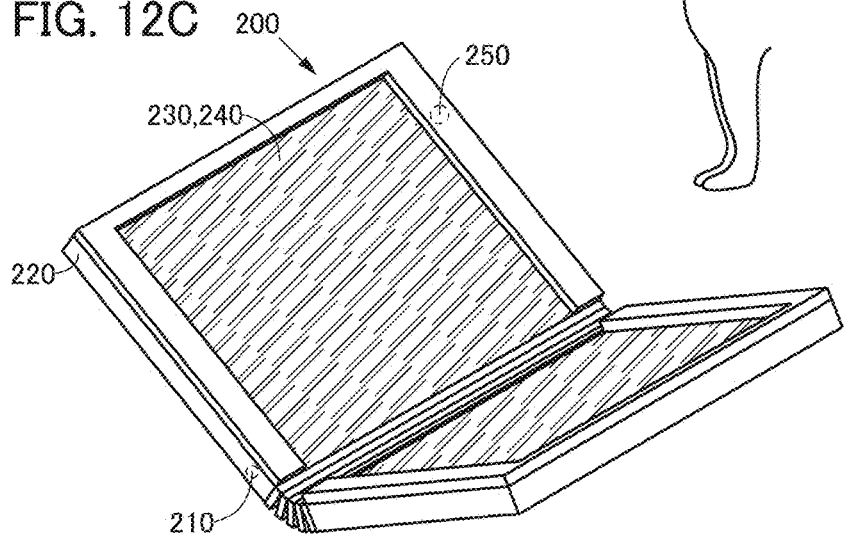

The display portion 230 can be mounted to a collar for a pet, such as a dog (see FIG. 12D). The use of the display panel described in Embodiment 1 for the display portion 230 achieves clear display regardless of indoors or outdoors. It is preferable that the display portion 230 be in the reflective display mode outdoors in the day time and be in the light-emitting display mode indoors in the night.

For example, a touch sensor, a microphone, a camera, or the like can be used as the input portion 240. Note that a touch sensor having a region overlapping with the display portion 230 can also be used.

For example, the display portion 230 can display pet's information for health management, identification number, and the like. A pet can wear it all day and all night. Driving primarily in the reflective display mode leads to the extension of battery life and a long period of use. In addition, the incorporation of GPS or the like allows the display portion 230 to provide location information.

Note that this embodiment can be combined with any of the other embodiments in this specification as appropriate.

Embodiment 7

An electronic paper display device is a reflective display and thus has a disadvantage that display is difficult to be recognized without external light.

The device described in Embodiment 1 has a structure in which light emission from an EL element is extracted through the opening provided in the reflective electrode of a reflective liquid crystal element. In this embodiment, light emission from an EL element is obtained through an opening provided in an electrode for applying electric field to a twisting ball or electronic ink. In this structure, a light-transmitting structure body 754 is provided in a region overlapping with the opening because there is a risk that light from an EL element might be blocked when the region overlapping with the opening overlaps with a twisting ball or electronic ink. The structure body 754 is made from an organic insulating material or an inorganic insulating material having a light-transmitting property. Note that the structure body 754 may also serve as a member for keeping the distance between the substrates.

Note that a twisting ball is a particle whose upper half and lower half have different hues. Electronic ink is particles (microcapsules) each of which is filled with colored charged particles and oil. Specifically, a microcapsule used here has a diameter of approximately greater than or equal to 10 µm and less than or equal to 200 µm in which transparent liquid, positively charged white microparticles, and negatively charged black microparticles are encapsulated. In the microcapsule provided between a first electrode and a second electrode, when an electric field is applied by the first electrode and the second electrode, the white microparticles and the black microparticles move in opposite directions to each other, so that white or black can be displayed.

A display element utilizing a twisting ball or a microcapsule and the principle is an electrophoretic display element, which is called an electronic paper display device in general.

This embodiment shows an example of a full-color displaying method in which a color filter is combined with a twisting ball exhibiting black and white. Note that the structure is not limited to that in FIG. 15. Full-color display may be performed in such a manner that voltage is applied to cyan-, magenta-, and white-colored particles that are provided in yellow-colored oil so that desired color can be displayed.

Figure 15:
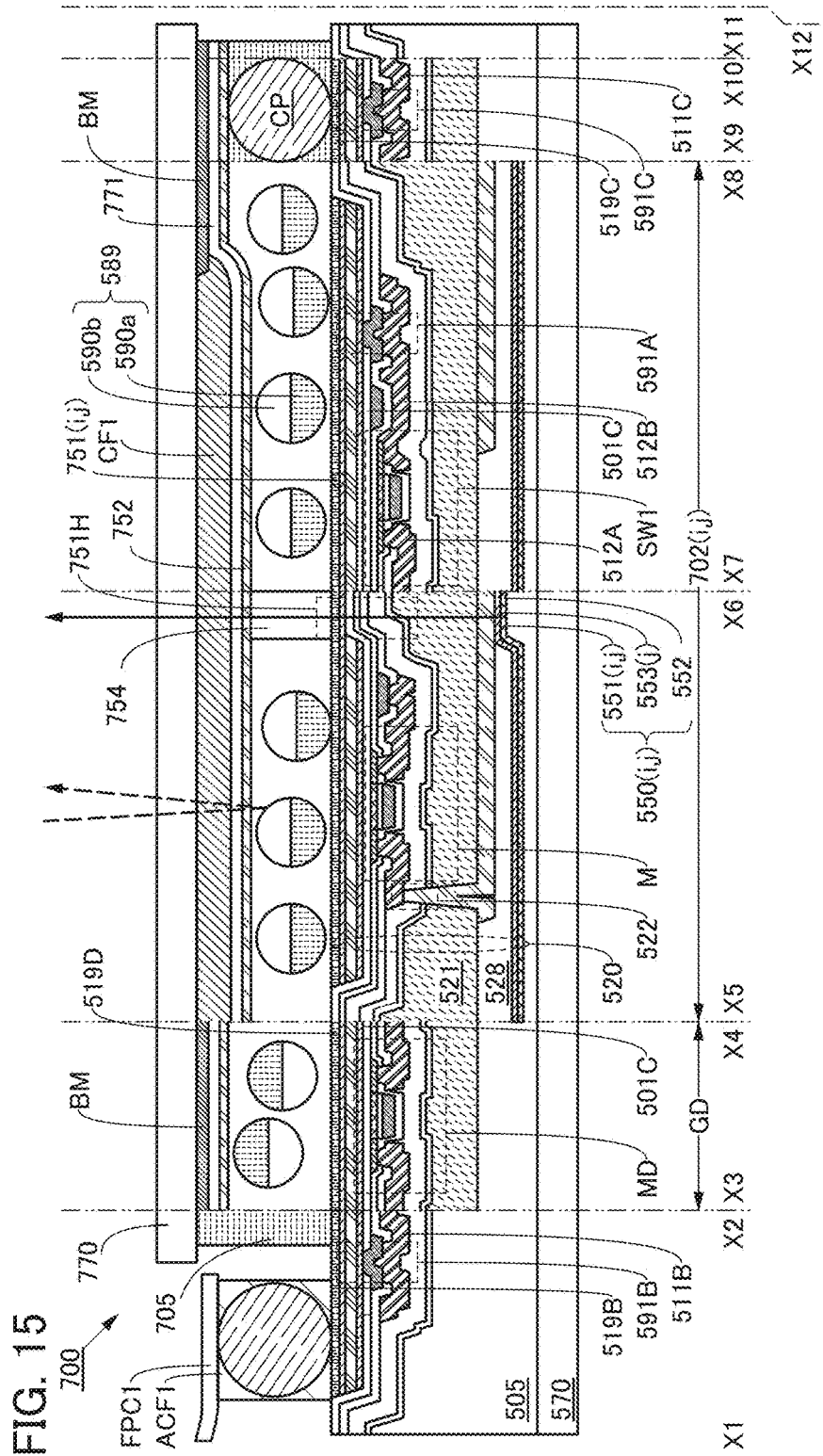
FIG. 15 is a cross-sectional view illustrating one embodiment of the present invention.

The electronic paper display device in FIG. 15 is an example of a display device using a twisting ball display system. The twisting ball display system is a displaying method: spherical particles each colored in black and white are arranged between the first electrode 751(i,j) and the second electrode 752 which are electrodes used for a display element, and a potential difference is generated between the first electrode and the second electrode to control orientation of the spherical particles.

The thin film transistor SW1 is a top-gate thin film transistor. The conductive film 512B serves as a source electrode or a drain electrode of the thin film transistor and is electrically connected to the first electrode 751(i,j) through the opening 591A. A spherical particle 589 including a black region 590a and a white region 590b is provided between the first electrode 751(i,j) and the second electrode 752 (see FIG. 15). In this embodiment, the first electrode 751(i,j) and the second electrode 752 correspond to a pixel electrode and a common electrode, respectively. The second electrode 752 is electrically connected to a common potential line provided over the substrate where the thin film transistor SW1 is provided. With the contact portion where the terminal 519C is connected to the conductive film 511C through the opening 591C, the second electrode 752 can be electrically connected to the common potential line through a conductor CP between a pair of substrates.

Instead of a twisting ball, an electrophoretic element utilizing a microcapsule or electronic liquid powder (registered trademark) can be used.

The electrophoretic display element has higher reflectance than a liquid crystal display element; thus, an auxiliary light and a polarizing plate are unnecessary, power consumption is low, and a display portion can be recognized even in a dim place. In addition, even when power is not supplied to the display portion, an image which has been displayed once can be maintained. Accordingly, a displayed image can be stored even if a semiconductor device having a display function (which may be referred to as a display device simply or a semiconductor device provided with a display device) is distanced from a radio wave source.

The electronic paper display device in FIG. 15 can perform display with an organic EL element in a dim place with almost no external light. Light emission from the organic EL element is extracted to the outside through the structure body 754. Each of the electrophoretic display element and the organic EL element includes a driver circuit and thus can perform display separately. They can also be driven concurrently. For example, the organic EL elements perform display while all the electrophoretic display elements exhibit black by voltage application thereto, in which case a clear display image is likely to be obtained.

The electronic paper display device described as an example in this embodiment has a large on-state current and can operate at a high speed because of the mounted thin film transistor of one embodiment of the present invention.

In addition, it is preferable that a thin film transistor have high voltage resistance in the electronic paper display device because high voltages are applied to drive the electrophoretic display element. Thus, an LDD region or an offset region in contact with a channel formation region is provided in order to increase the voltage resistance of the thin film transistor.

Furthermore, this embodiment can be combined with any of the other embodiments.

Embodiment 8

In this embodiment, a display module and electronic devices which include a reflective display device of one embodiment of the present invention will be described with reference to FIGS. 13A to 13G.

FIGS. 13A to 13G illustrate electronic devices. These electronic devices can include a housing 5000, a display portion 5001, a speaker 5003, an LED lamp 5004, operation keys 5005 (including a power switch or an operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 5008, and the like.

Figure 13A:
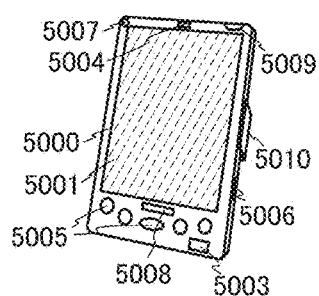
FIGS. 13A, 13B, 13C, 13D, 13E, 13F, and 13G are diagrams illustrating the structure of an electronic device of one embodiment.
Figure 13B:
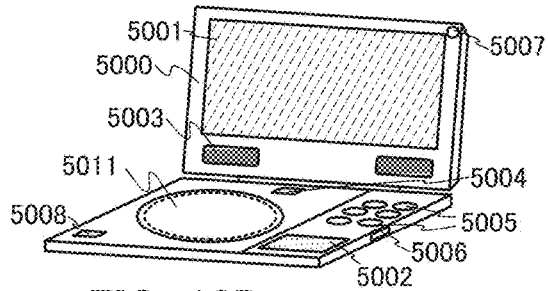
Figure 13C:

FIG. 13A shows a mobile computer which can include a switch 5009, an infrared port 5010, and the like in addition to the above-described components. FIG. 13B shows a portable image reproducing device provided with a memory medium (e.g., a DVD reproducing device), which can include a second display area 5002, a memory medium read portion 5011, and the like in addition to the above-described components. FIG. 13C shows a smart watch.

The smart watch shown in FIG. 13C includes a housing 7302, a display panel 7304, operation buttons 7311 and 7312, a connection terminal 7313, a band 7321, a clasp 7322, and the like.

The display panel 7304 mounted in the housing 7302 serving as a bezel includes a non-rectangular display region. Without limitation to a circular shape as illustrated in FIG. 13C, the display panel 7304 can have various top surfaces, such as an elliptical shape or a polygonal shape having more than or equal to five corners. Note that the display panel 7304 may have a rectangular display region. The display panel 7304 can display an icon 7305 indicating time, another icon 7306, and the like.

As a material of the housing 7302, alloy, plastic, ceramic, or a material containing carbon fiber can be used. Carbon fiber reinforced plastic (CFRP), which is a material containing carbon fiber, has advantages of lightweight and corrosion-free; however, it is black and thus has limitations on exterior and design. The CFRP can be referred to as a kind of a reinforced plastic. Fiberglass reinforced plastic or KFRP containing Kevlar may be used. Alloy is preferable because fiber has higher possibility of separation from resin by high impact than alloy. The alloy includes aluminum alloy and magnesium alloy. In particular, amorphous alloy (also referred to as metal glass) containing zirconium, copper, nickel, and titanium is superior in terms of high elastic strength. This amorphous alloy includes a glass transition region at room temperature, which is also referred to as a bulk-solidifying amorphous alloy and substantially has an amorphous atomic structure. By a solidification casting method, an alloy material is molded in a mold of at least part of the housing and coagulated so that the part of the housing is formed using a bulk-solidifying amorphous alloy. The amorphous alloy may include beryllium, silicon, niobium, boron, gallium, molybdenum, tungsten, manganese, iron, cobalt, yttrium, vanadium, phosphorus, carbon, or the like in addition to zirconium, copper, nickel, and titanium. Note that the term alloy refer to both a complete solid solution alloy which has a single solid phase structure and a partial solution that has two or more phases. The housing 7302 made from amorphous alloy can have high elastic strength.

Note that the smart watch shown in FIG. 13C can have a variety of functions, such as a function of displaying a variety of information (e.g., a still image, a moving image, and a text image) on a display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading program or data stored in a recording medium and displaying the program or data on a display portion.

The housing 7302 can include a speaker, a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone, and the like. Note that the smart watch can be manufactured using the light-emitting element for the display panel 7304.

Figure 13D:
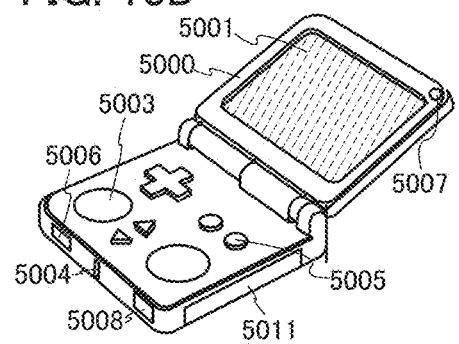
Figure 13E:
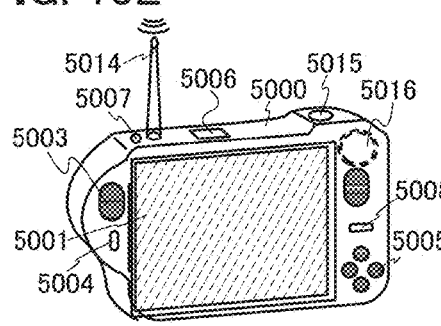
Figure 13F:
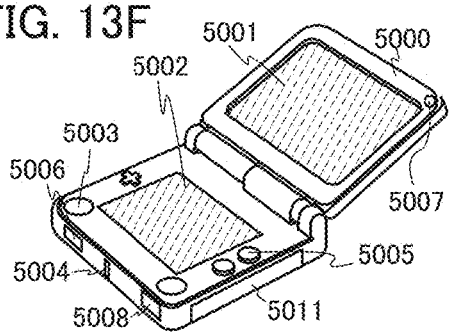
Figure 13G:
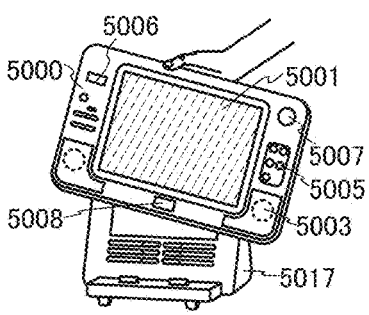

FIG. 13D shows a portable game console which can include the memory medium read portion 5011 and the like in addition to the above-described components. FIG. 13E illustrates a digital camera which has a television reception function and can include an antenna 5014, a shutter button 5015, an image receiving portion 5016, and the like in addition to the above-described components. FIG. 13F shows a portable game console which can include the second display area 5002, the memory medium read portion 5011, and the like in addition to the above-described components. FIG. 13G illustrates a portable television receiver that can include a charger 5017 capable of transmitting and receiving signals, and the like in addition to the above-described components.

The electronic devices illustrated in FIGS. 13A to 13G can have a variety of functions. For example, there are a function of displaying a variety of information (e.g., a still image, a moving image, and a text image) on a display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading program or data stored in a recording medium and displaying the program or data on a display portion. Furthermore, the electronic device including a plurality of display portions can have a function of displaying image information mainly on one display portion while displaying text information on another display portion, a function of displaying a three-dimensional image by displaying images where parallax is considered on a plurality of display portions, or the like. Furthermore, the electronic device including an image receiving portion can have a function of photographing a still image, a function of photographing a moving image, a function of automatically or manually correcting a photographed image, a function of storing a photographed image in a memory medium (an external memory medium or a memory medium incorporated in the camera), a function of displaying a photographed image on the display portion, or the like. Note that functions of the electronic devices illustrated in FIGS. 13A to 13G are not limited thereto, and the electronic devices can have a variety of functions.

Note that this embodiment can be combined with any of the other embodiments in this specification as appropriate.

Embodiment 9

In this embodiment, electronic devices each including the display panel of one embodiment of the present invention are described with reference to FIGS. 16A and 16B and FIGS. 17A to 17C.

Figure 16A:
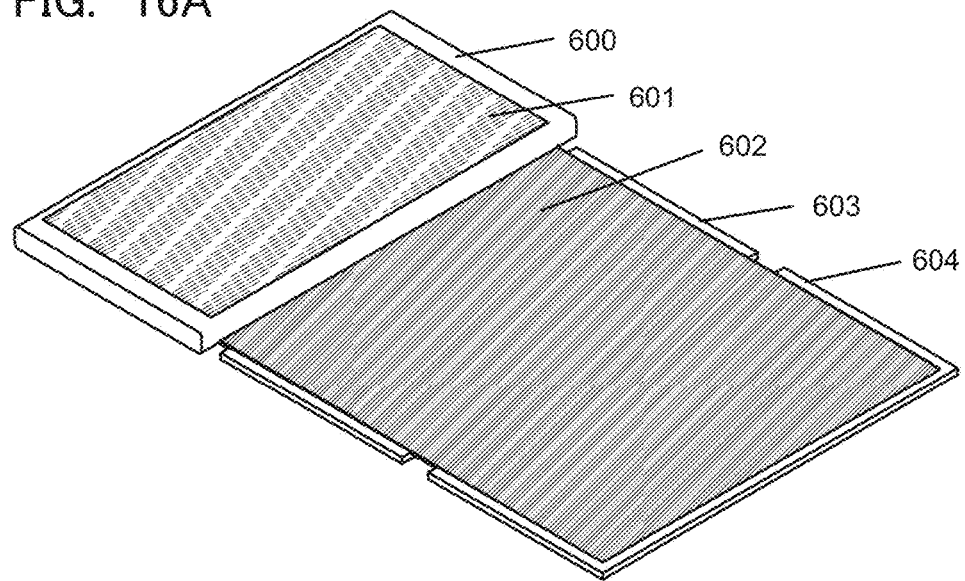
FIGS. 16A and 16B are perspective views illustrating the structure of an electronic device according to one embodiment.
Figure 16B:
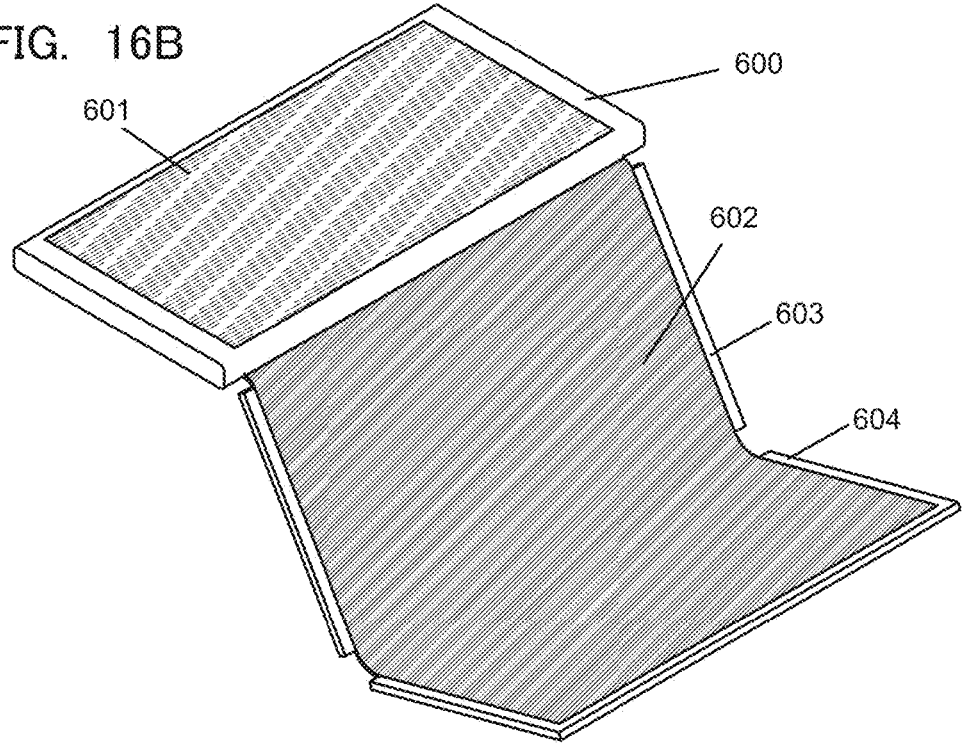

FIG. 16A shows an example of a perspective view of a mobile information terminal. Mobile information terminals are required to have a large screen and to be compact, portable, and easy-to-store. A display portion 602 is flexible and foldable. FIG. 16B is a perspective view of the mobile information terminal which is midway through folding.

A housing 600 of the mobile information terminal includes a display portion 601. It is desirable that the bezel for the display portion 601 be reduced. This is because a large distance between the display portions 601 and 602 cuts an image. In this embodiment, the application of the s-channel structure to a transistor in a driver circuit of a display device can reduce the channel width W, so that the area of the driver circuit can be reduced. For example, the width of the driver circuit is reduced to 0.5 mm, preferably 0.3 mm, resulting in a narrower bezel.

As a material of the housing 600 of the mobile information terminal, alloy, plastic, ceramic, or a material containing carbon fiber can be used. The alloy includes aluminum alloy and magnesium alloy. In particular, amorphous alloy containing zirconium, copper, nickel, and titanium is superior in terms of high elastic strength. Mobile information terminals are required to have resistance to high impact. When alloy is used as a material of the housing of the mobile information terminal and plastic films are used as all the substrates of the display portions 601 and 602, the mobile information terminal includes almost no breakable members; thus, the mobile information terminal can withstand impact, such as drop impact.

The display portion 602 includes backboards 603 and 604 as folding support members. The housing 600 is connected to the backboard 603 with a connection member. The backboard 604 preferably has a portion for fixing to the housing 600 or for attaching to and releasing from the housing 600 with a magnet or the like.

Figure 17A:
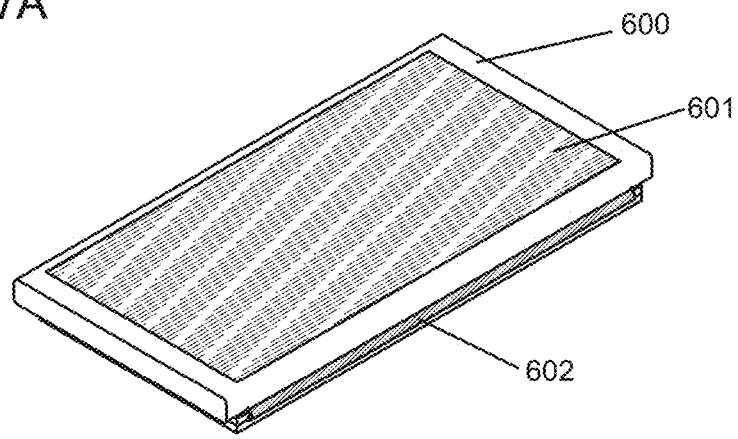
FIGS. 17A, 17B, and 17C are perspective views and a cross-sectional view illustrating the structure of an electronic device according to one embodiment.
Figure 17B:
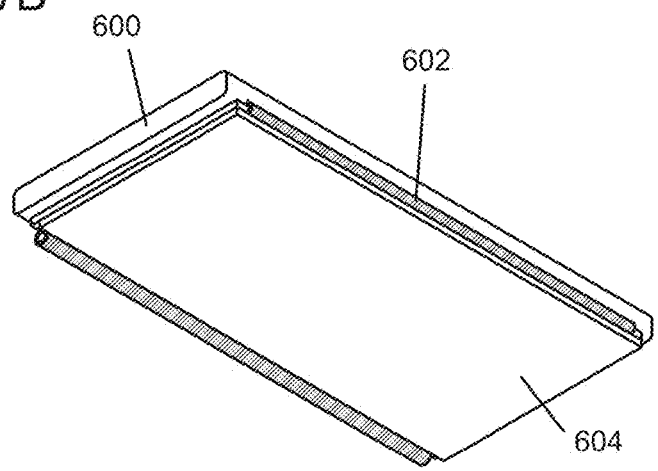

FIG. 17A is a perspective view of a folded mobile information terminal. FIG. 17B is a perspective view seen from a backboard 604 side.

Figure 17C:
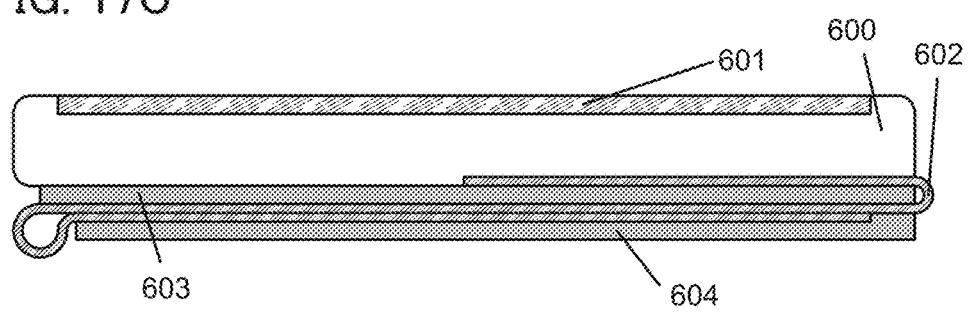

FIG. 17C is an example of a cross-sectional view of the mobile information terminal.

Note that the display portions 601 and 602 may be incorporated into display devices having different configurations. For example, the display device described in Embodiment 1 is used for the display portion 601, whereas the electronic paper display device described in Embodiment 7 is used for the display portion 602. In particular, when a liquid crystal display element described in Embodiment 1 is used for the display portion 602 that is bended and folded, a difficulty in display may arise because of a changed cell gap. Also when the display portion 602 is a touch input panel, the use of the display device described in Embodiment 1 has a probability of causing display distortion because the cell gap of the liquid crystal display element is changed by a push of a screen by a finger or the like. Therefore, it is useful to use an electronic paper display device which is less likely to be affected by cell gap for the display portion 602. Because the display portion 601 is used as a main display, it is preferably a display device including both of the EL element and the liquid crystal element which can perform favorable display regardless of the presence or absence of external light. When external light is utilized, a reflective liquid crystal element is used, so that power consumption can be reduced. For this reason, it is useful as a mobile information terminal.

This embodiment can be freely combined with any of the other embodiments.

This application is based on Japanese Patent Application serial No. 2015-157620 filed with Japan Patent Office on Aug. 7, 2015, the entire contents of which are hereby incorporated by reference.

What is claimed is:

1. A display panel comprising:
a driver circuit;
a signal line electrically connected to the driver circuit; and
a pixel electrically connected to the signal line, the pixel comprising:
 a first display element comprising a first conductive film;
 a second conductive film comprising a region overlapping with the first conductive film;
 an insulating film comprising a region between the first conductive film and the second conductive film;
 a pixel circuit electrically connected to the second conductive film and the signal line, the pixel circuit comprising a first transistor comprising silicon in a channel formation region; and
 a second display element electrically connected to the pixel circuit,
wherein the insulating film comprises a first opening,
wherein the first conductive film comprises a second opening,
wherein the second opening overlaps the second display element, and
wherein the second conductive film is electrically connected to the first conductive film in the first opening.

2. The display panel according to claim 1,
wherein the first conductive film is a reflective film and is configured to control an intensity of reflected light,
wherein the reflective film is configured to reflect incident light, and
wherein the second display element is configured to emit light toward the second opening.

3. The display panel according to claim 1, wherein the first transistor comprises a low-concentration impurity region.

4. The display panel according to claim 1,
wherein the driver circuit comprises a second transistor,
wherein the second transistor comprises a first insulating layer over a third conductive film, a semiconductor layer comprising silicon and including the channel formation region over the first insulating layer, a second insulating layer over the semiconductor layer, and a fourth conductive film over the second insulating layer,
wherein the fourth conductive film covers a side surface of the semiconductor layer with the second insulating layer provided therebetween, and
wherein the semiconductor layer is surrounded by the third conductive film and the fourth conductive film in a cross section in a channel width direction.

5. The display panel according to claim 1, wherein the first transistor comprises polycrystalline silicon.

6. The display panel according to claim 1, wherein the first transistor is a p-channel type.

7. The display panel according to claim 4,
wherein the third conductive film is a first gate electrode of the second transistor, and
wherein the fourth conductive film is a second gate electrode of the second transistor.

8. A display panel comprising:
a driver circuit;
a signal line electrically connected to the driver circuit; and
a pixel electrically connected to the signal line, the pixel comprising:
 a first display element comprising a first conductive film;

a second conductive film comprising a region overlapping with the first conductive film;

an insulating film comprising a region between the first conductive film and the second conductive film;

a pixel circuit electrically connected to the second conductive film and the signal line, the pixel circuit comprising a first transistor comprising silicon in a channel formation region; and a second display element electrically connected to the pixel circuit, wherein the insulating film comprises a first opening, wherein the first conductive film comprises a second opening, wherein the second opening overlaps the second display element, wherein the second conductive film is electrically connected to the first conductive film in the first opening, wherein the first display element comprises a charged particle, and wherein the second display element comprises a layer including a light-emitting material.

9. The display panel according to claim 8, wherein the first display element further comprises a color filter, wherein the first conductive film is a reflective film configured to reflect incident light, wherein the second opening overlaps with a structure body, and wherein the second opening and the structure body are configured to transmit light emitted from the second display element.

10. The display panel according to claim 8, wherein the first conductive film is a reflective film, wherein the charged particle is a colored charged particle, wherein the reflective film is configured to reflect incident light, wherein the second opening overlaps with a structure body, and wherein the second opening and the structure body are configured to transmit light emitted from the second display element.

11. The display panel according to claim 8, wherein the first transistor comprises a low-concentration impurity region.

12. The display panel according to claim 8, wherein the driver circuit comprises a second transistor, wherein the second transistor comprises a first insulating layer over a third conductive film, a semiconductor layer comprising silicon and including the channel formation region over the first insulating layer, a second insulating layer over the semiconductor layer, and a fourth conductive film over the second insulating layer, wherein the fourth conductive film covers a side surface of the semiconductor layer with the second insulating layer provided therebetween, and wherein the semiconductor layer is surrounded by the third conductive film and the fourth conductive film in a cross section in a channel width direction.

13. The display panel according to claim 8, wherein the first transistor comprises polycrystalline silicon.

14. The display panel according to claim 8, wherein the first transistor is a p-channel type.

15. The display panel according to claim 12, wherein the third conductive film is a first gate electrode of the second transistor, and wherein the fourth conductive film is a second gate electrode of the second transistor.

* * * * *